(12) United States Patent
Fricker et al.

(10) Patent No.: US 10,784,128 B2
(45) Date of Patent: Sep. 22, 2020

(54) APPARATUS AND METHOD FOR SECURING COMPONENTS OF AN INTEGRATED CIRCUIT

(71) Applicant: Cerebras Systems Inc., Los Altos, CA (US)

(72) Inventors: Jean-Philippe Fricker, Los Altos, CA (US); Frank Jun, Los Altos, CA (US); Paul Kennedy, Los Altos, CA (US)

(73) Assignee: Cerebras Systems Inc., Los Altos, CA (US)

( * ) Notice: Subject to any disclaimer, the term of this patent is extended or adjusted under 35 U.S.C. 154(b) by 0 days.

(21) Appl. No.: 16/567,097

(22) Filed: Sep. 11, 2019

(65) Prior Publication Data

US 2020/0006097 A1  Jan. 2, 2020

Related U.S. Application Data

(63) Continuation of application No. 16/267,644, filed on Feb. 5, 2019, now Pat. No. 10,453,717, which is a
(Continued)

(51) Int. Cl.
*H01L 21/67* (2006.01)
*H01L 25/00* (2006.01)
(Continued)

(52) U.S. Cl.
CPC ........ *H01L 21/67121* (2013.01); *B32B 37/10* (2013.01); *H01L 24/00* (2013.01);
(Continued)

(58) Field of Classification Search
CPC ..... H01L 24/26; H01L 24/95; H01L 25/0657; H01L 21/67121; H01L 25/50
See application file for complete search history.

(56) References Cited

U.S. PATENT DOCUMENTS

| 4,932,883 A | 6/1990 | Hsia et al. |
| 4,998,885 A | 3/1991 | Beaman |

(Continued)

OTHER PUBLICATIONS

International Search Report and Written Opinion for PCT Application No. PCT/US2018/039700 dated Sep. 13, 2018.
(Continued)

*Primary Examiner* — Selim U Ahmed
(74) *Attorney, Agent, or Firm* — Jeffrey Schox

(57) ABSTRACT

Systems and methods of securing an integrated circuit assembly includes: arranging a plurality of securing elements within a plurality of orifices fabricated within one or more layer components of a plurality of layer components of an integrated circuit assembly; applying a mechanical compression load against the integrated circuit assembly that uniformly compresses together the plurality of layer components of the integrated circuit assembly; after applying the mechanical compression load to the integrated circuit assembly, fastening the plurality of securing elements while the integrated circuit assembly is in a compressed state based on the mechanical compression load; and terminating the application of the mechanical compression load against the integrated circuit assembly based on the fastening of the plurality of securing elements.

20 Claims, 21 Drawing Sheets

Related U.S. Application Data continuation of application No. 16/056,792, filed on Aug. 7, 2018, now Pat. No. 10,242,891.

(60) Provisional application No. 62/549,677, filed on Aug. 24, 2017.

(51) Int. Cl.
*H01L 23/00* (2006.01)
*B32B 37/10* (2006.01)
*H01R 43/00* (2006.01)
*H01L 25/065* (2006.01)

(52) U.S. Cl.
CPC .............. *H01L 24/75* (2013.01); *H01L 24/83* (2013.01); *H01L 24/94* (2013.01); *H01L 25/50* (2013.01); *H01R 43/007* (2013.01); *H01L 25/0657* (2013.01); *H01L 2224/1134* (2013.01); *H01L 2224/29291* (2013.01); *H01L 2224/29298* (2013.01); *H01L 2224/32225* (2013.01); *H01L 2224/83201* (2013.01); *H01L 2924/14* (2013.01); *H01L 2924/15192* (2013.01)

(56) References Cited

U.S. PATENT DOCUMENTS

| | | | |
|---|---|---|---|
| 5,140,405 A | 8/1992 | King et al. | |
| 6,281,577 B1 | 8/2001 | Oppermann et al. | |
| 6,477,058 B1 * | 11/2002 | Luebs | H05K 1/141 174/250 |
| 6,936,521 B2 | 8/2005 | Chien | |
| 7,681,309 B2 * | 3/2010 | Miller | H01L 23/13 29/739 |
| 8,316,329 B1 | 11/2012 | Rigby et al. | |
| 10,468,369 B2 | 11/2019 | Fricker | |
| 2002/0185661 A1 | 12/2002 | Kawanobe et al. | |
| 2003/0006493 A1 | 1/2003 | Shimoishizaka et al. | |
| 2003/0146510 A1 | 8/2003 | Chien | |
| 2005/0110160 A1 | 5/2005 | Faroog et al. | |
| 2006/0043567 A1 | 3/2006 | Palanduz | |
| 2006/0141667 A1 | 6/2006 | Milbrand et al. | |
| 2008/0157396 A1 | 7/2008 | Yang | |
| 2009/0108441 A1 * | 4/2009 | Barr | H02M 7/003 257/727 |
| 2011/0147911 A1 | 6/2011 | Kohl et al. | |
| 2013/0155796 A1 | 6/2013 | Sugawara | |
| 2014/0035093 A1 | 2/2014 | Pincu et al. | |
| 2014/0035106 A1 | 2/2014 | Vu et al. | |
| 2014/0070423 A1 | 3/2014 | Woychik et al. | |
| 2014/0084427 A1 | 3/2014 | Gaskins | |
| 2015/0076714 A1 | 3/2015 | Haba et al. | |
| 2016/0218057 A1 | 7/2016 | Lee et al. | |
| 2017/0084539 A1 | 3/2017 | Gao et al. | |
| 2017/0374738 A1 | 12/2017 | Lee et al. | |
| 2018/0068938 A1 | 3/2018 | Yazdani | |

OTHER PUBLICATIONS

International Search Report and Written Opinion for PCT Application No. PCT/US18/045519, dated Oct. 26, 2018.

International Search Report and Written Opinion for PCT Application No. PCT/US18/041090, dated Sep. 19, 2018.

* cited by examiner

200

```
┌─────────────────────────────────────────────┐
│    Providing a Semiconductor Substrate S210 │
└─────────────────────────────────────────────┘

┌─────────────────────────────────────────────┐
│         Identifying a Largest Square S215   │
└─────────────────────────────────────────────┘

┌─────────────────────────────────────────────┐
│         Fabricating Circuitry Layers S220   │
└─────────────────────────────────────────────┘

┌─────────────────────────────────────────────┐
│    Providing Self-Correcting Mechanisms S222│
└─────────────────────────────────────────────┘

┌─────────────────────────────────────────────┐
│         Providing a Protective Barrier S225 │
└─────────────────────────────────────────────┘

┌─────────────────────────────────────────────┐
│     Fabricating Inter-Die Connections S230  │
└─────────────────────────────────────────────┘

┌─────────────────────────────────────────────┐
│     Semiconductor Substrate Reduction S240  │
└─────────────────────────────────────────────┘
```

Providing IC Components With Orifices S1105

Arranging the IC Assembly Components S1110

Providing Securing Elements S1120

Implementing a Pressing Process S1130

Fastening the Securing Elements S1140

Terminating the Press S1150

FIGURE 11

APPARATUS AND METHOD FOR SECURING COMPONENTS OF AN INTEGRATED CIRCUIT

CROSS-REFERENCE TO RELATED APPLICATIONS

This application is a continuation application of U.S. patent application Ser. No. 16/267,644, filed 5 Feb. 2019, which is a continuation of U.S. Pat. No. 10,242,891, filed 7 Aug. 2018, which claims the benefit of U.S. Provisional Application No. 62/549,677, filed 24 Aug. 2017, which are all incorporated herein in their entireties by this reference.

TECHNICAL FIELD

The inventions relate generally to the computer chip architecture and fabrication field, and more specifically to a new and useful computer chip architecture and computer chip manufacturing methods in the computer chip architecture field.

BACKGROUND

While the concept of artificial intelligence has been explored for some time, the modern applications of artificial intelligence have exploded such that artificial intelligence is being integrated into many devices and decision-making models to improve their learning, reasoning, data processing capabilities, and the like of the devices. The most apparent and broad applications of artificial intelligence include machine learning, natural language processing, computer vision, robotics, knowledge reasoning, planning, and general artificial intelligence.

To be effective, many of the above-noted broad applications of artificial intelligence require the consumption of extremely large data sets in the initial training of the artificial intelligence algorithms (e.g., deep learning, recurrent neural networks, etc.) being implemented in the specific applications and/or devices (e.g., autonomous vehicles, medical diagnostics, etc.). Because the data sets used in training are often very large and the underlying computer architecture may not be specifically designed for artificial intelligence training, the training of an artificial intelligence algorithm may require thousands of hours of data processing by the underlying computer architecture. While it may be possible to scale or increase the number of computers or servers used in ingesting data sets for training an artificial intelligence algorithm, this course of action often proves to not be economically feasible.

Similar data processing issues arise in the implementation or execution of the artificial intelligence algorithms due to the large amount of data being captured such as data originating from billions of Internet transactions, remote sensors for computer vision, and the like. The modern remote distributed networked servers (e.g., the cloud) and onboard computer processors (e.g., GPUs, CPUs, etc.) appear to be inadequate for ingesting and processing such great volumes of data efficiently to maintain pace with the various implementations of the artificial intelligence algorithms.

Accordingly, there is a need in the semiconductor space and specifically in the computer chip architecture field for an advanced computing processor, computing server, or the like that is capable of rapidly and efficiently ingesting large volumes of data for at least the purposes of allowing enhanced artificial intelligence algorithms and machine learning models and training to be implemented. Additionally, these advanced computing systems may function to enable improved data processing techniques and related or similar complex and processor-intensive computing to be achieved.

The inventors of the inventions described in the present application have designed an integrated circuit architecture that allows for enhanced data processing capabilities and have further discovered related methods and architectures for fabricating the integrated circuit(s), packaging the integrated circuit(s), powering/cooling the integrated circuit(s), and the like.

The below-described embodiments of the present application provide such advanced and improved computer chip architecture and related IC fabrication techniques.

SUMMARY OF THE INVENTION

In one embodiment, a method of securing an integrated circuit assembly includes arranging a plurality of securing elements within a plurality of orifices fabricated within one or more layer components of a plurality of layer components of an integrated circuit assembly; applying a mechanical compression load against the integrated circuit assembly that uniformly compresses together the plurality of layer components of the integrated circuit assembly; after applying the mechanical compression load to the integrated circuit assembly, fastening the plurality of securing elements while the integrated circuit assembly is in a compressed state based on the mechanical compression load; and terminating the application of the mechanical compression load against the integrated circuit assembly based on the fastening of the plurality of securing elements.

In one embodiment, at least one layer component of the integrated circuit assembly comprises a semiconductor substrate having: a plurality of die formed with the semiconductor substrate; a circuit layer formed at each of the plurality of die; and a plurality of inter-die connections that communicatively connect disparate die formed with the substrate, wherein each of the plurality of inter-die connections extends between each pair of adjacent die of the plurality of die.

In one embodiment, the plurality of layer components further comprising: an electronic circuit substrate; and an elastomeric connector arranged between the semiconductor substrate and the electronic circuit substrate.

In one embodiment, the mechanical compression load is applied by a clamping assembly, the clamping assembly comprising: a load application component that applies the mechanical compression load against the plurality of layer components of the integrated circuit assembly; a mechanical securing component that fastens each of the plurality of securing elements within the integrated circuit assembly.

In one embodiment, each of the plurality of securing elements comprises an elastic member arranged between an abutment portion of each securing element and a surface of one of the plurality of layers of the integrated circuit assembly, the elastic member absorbs expansion forces and contraction forces of the one or more of the plurality of layer components of the integrated circuit assembly.

In one embodiment, the securing element comprises a plurality of elastic members disposed between a surface of abutment portion of the securing element and a surface of a layer component comprising a backing element of the integrated circuit assembly; fastening the securing element into the integrated circuit assembly causes the surface of the abutment portion to come into contact with the plurality of the elastic members and compress the plurality of elastic members from a first uncompressed position to a second compressed position.

In one embodiment, the method includes arranging a plurality of fastening members within or at a surface of an electronic circuit substrate of the integrated circuit assembly, wherein fastening the plurality of securing elements includes fastening one end of each of the plurality of securing element with one fastening member of the plurality of fastening members.

In one embodiment, fastening the plurality of securing elements is triggered in response to achieving a desired mechanical compression load;

In one embodiment, fastening the plurality of securing elements includes fastening each of the plurality of securing elements until a shoulder of each of the plurality of securing elements comes into contact with a surface of a fastening member.

In one embodiment, the method includes synchronously fastening each of the plurality of securing elements within the integrated circuit assembly while the integrated circuit assembly is in a compressed state due to the applied mechanical compression load.

In one embodiment, the mechanical compression load is maintained against the integrated circuit assembly until each of the plurality of securing elements is fastened to the integrated circuit assembly.

In one embodiment, the method includes fabricating the plurality of orifices in each of the plurality of layer components of the integrated circuit assembly, wherein the fabricating the plurality of orifices includes positioning each of the plurality of orifices along each layer component of the integrated circuit layer according to a first predetermined pitch along a first direction and a second predetermined pitch along a second direction; aligning each of the plurality of layer components of the integrated circuit assembly according to the plurality of orifices in each of the plurality of layer components.

In one embodiment, each orifice comprises a through hole that extends through each of the plurality of layer components of the integrated layer assembly.

In one embodiment, each orifice comprises a through hole that extends through at least one of the plurality of layer components of the integrated layer assembly and terminates at a cavity within a terminal layer of the integrated circuit assembly.

In one embodiment, a system of securing an integrated circuit assembly includes an integrated circuit assembly having a plurality of layer components, wherein the integrated circuit assembly comprise a plurality of orifices; a plurality of securing elements arranged within the plurality of orifices of the integrated circuit assembly; a clamping assembly comprising: a load application component that applies a mechanical load against one or more of the plurality of layer components of the integrated circuit assembly; a mechanical securing component that fastens each of the plurality of securing elements within the integrated circuit assembly while the mechanical load is continuously applied against the integrated circuit assembly.

In one embodiment, at least one layer component of the plurality of layer components of the integrated circuit assembly comprises a semiconductor substrate having: a plurality of die formed with the semiconductor substrate; a circuit layer formed at each of the plurality of die; and a plurality of inter-die connections that communicatively connect disparate die formed with the substrate, wherein each of the plurality of inter-die connections extends between each pair of adjacent die of the plurality of die.

In one embodiment, the plurality of layer components further comprising: an electronic circuit substrate; and an elastomeric connector arranged between the semiconductor substrate and the electronic circuit substrate.

In one embodiment, each of the plurality of securing elements comprises an elastic member arranged between an abutment portion of each securing element and a surface of one of the plurality of layers of the integrated circuit assembly.

In one embodiment, the system includes a plurality of fastening members within or at a surface of an electronic circuit substrate of the integrated circuit assembly, wherein fastening the plurality of securing elements includes fastening one end of each of the plurality of securing element with one fastening member of the plurality of fastening members.

In one embodiment, the elastic member comprises a plurality of Belville springs.

BRIEF DESCRIPTION OF THE FIGURES

FIG. 2 illustrates a method 200 in accordance with one or more embodiments of the present application;

FIG. 11 illustrates a method 1100 in accordance with one or more embodiments of the present application.

DESCRIPTION OF THE PREFERRED EMBODIMENTS

Figure 1:
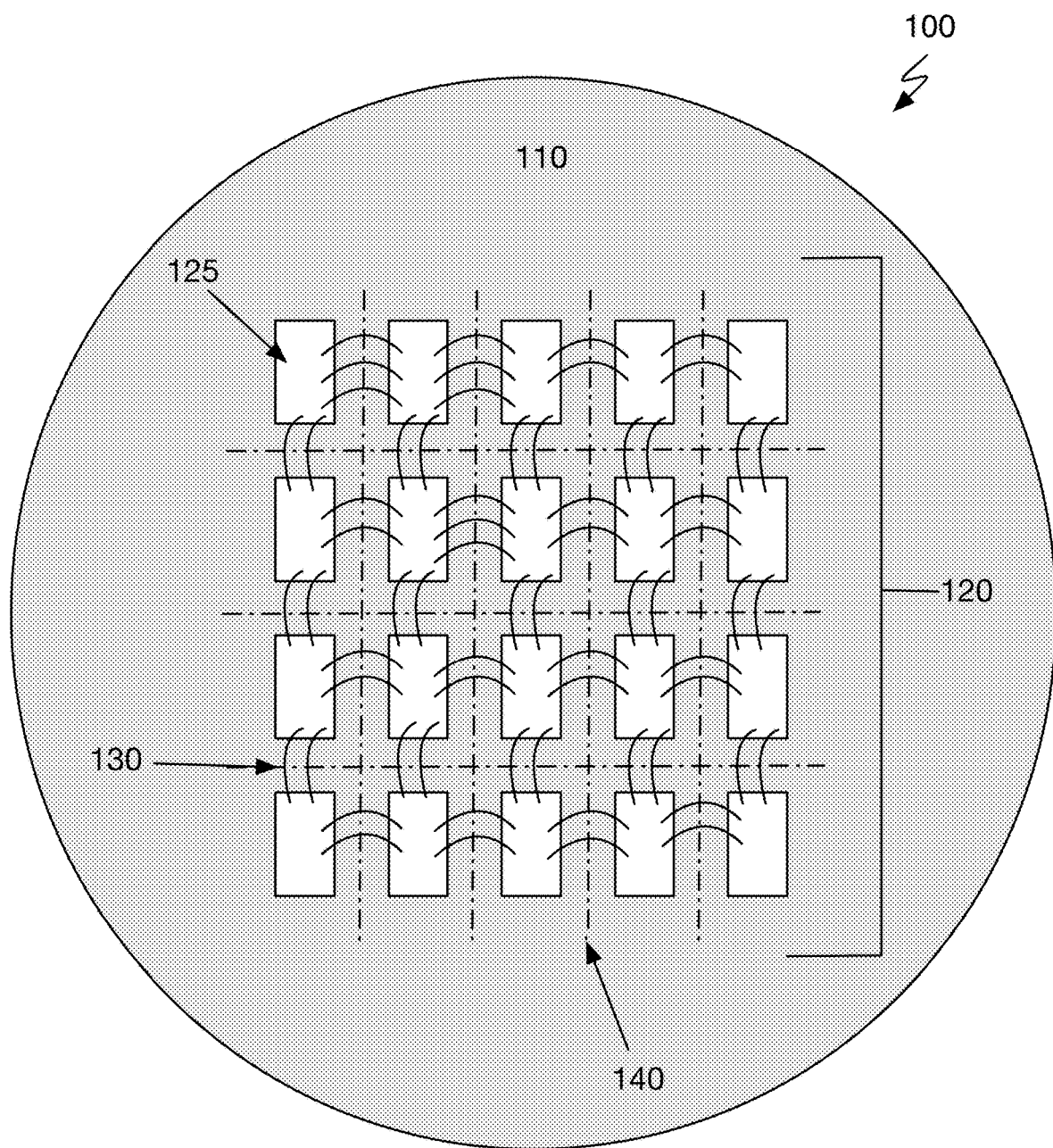
FIG. 1 illustrates a schematic of a system 100 in accordance with one or more embodiments of the present application.
Figure 3A:
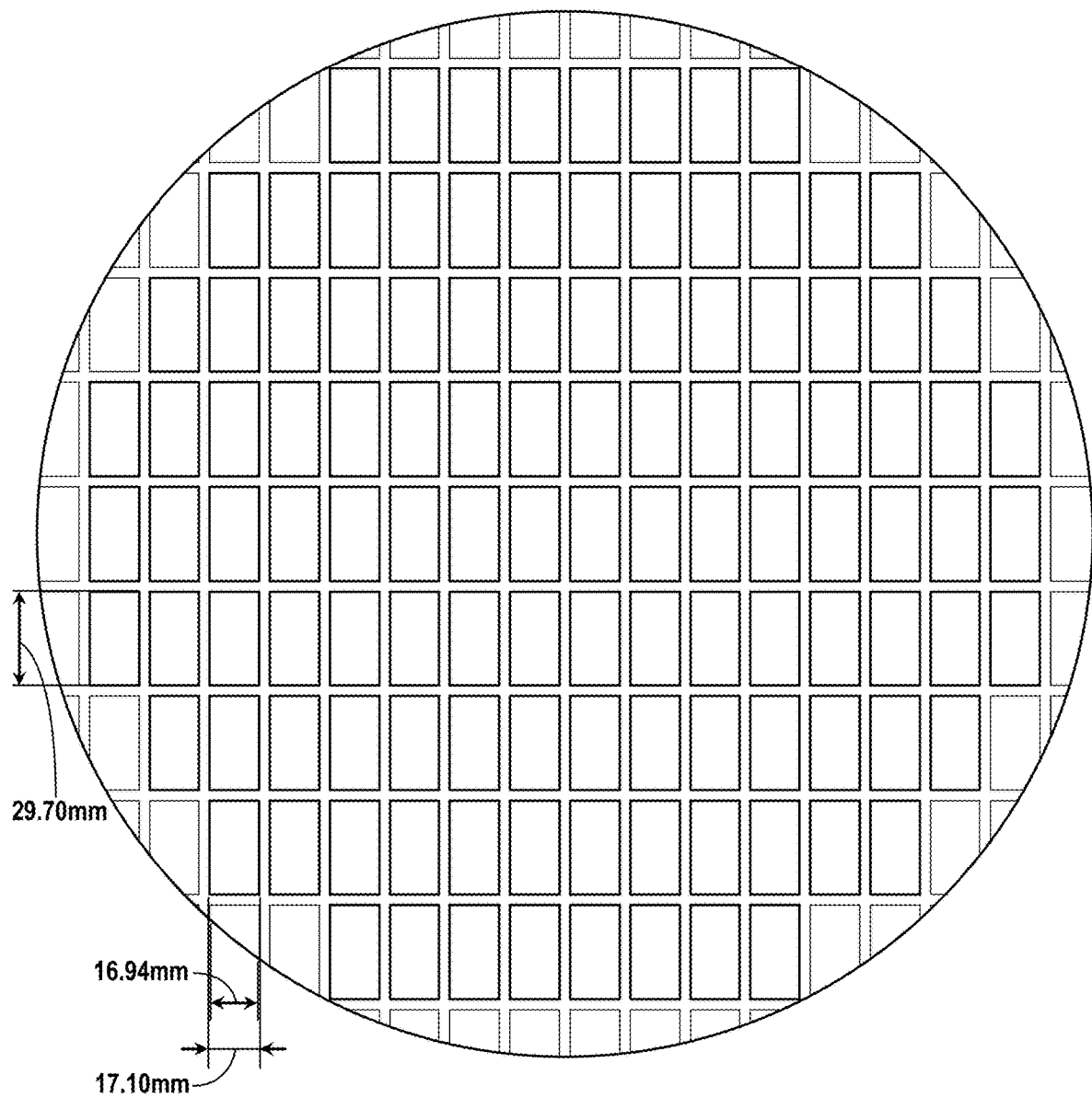
FIG. 3A-3D illustrate several schematics of a semiconductor substrate without and with interconnections in accordance with one or more embodiments of the present application.
Figure 3B:
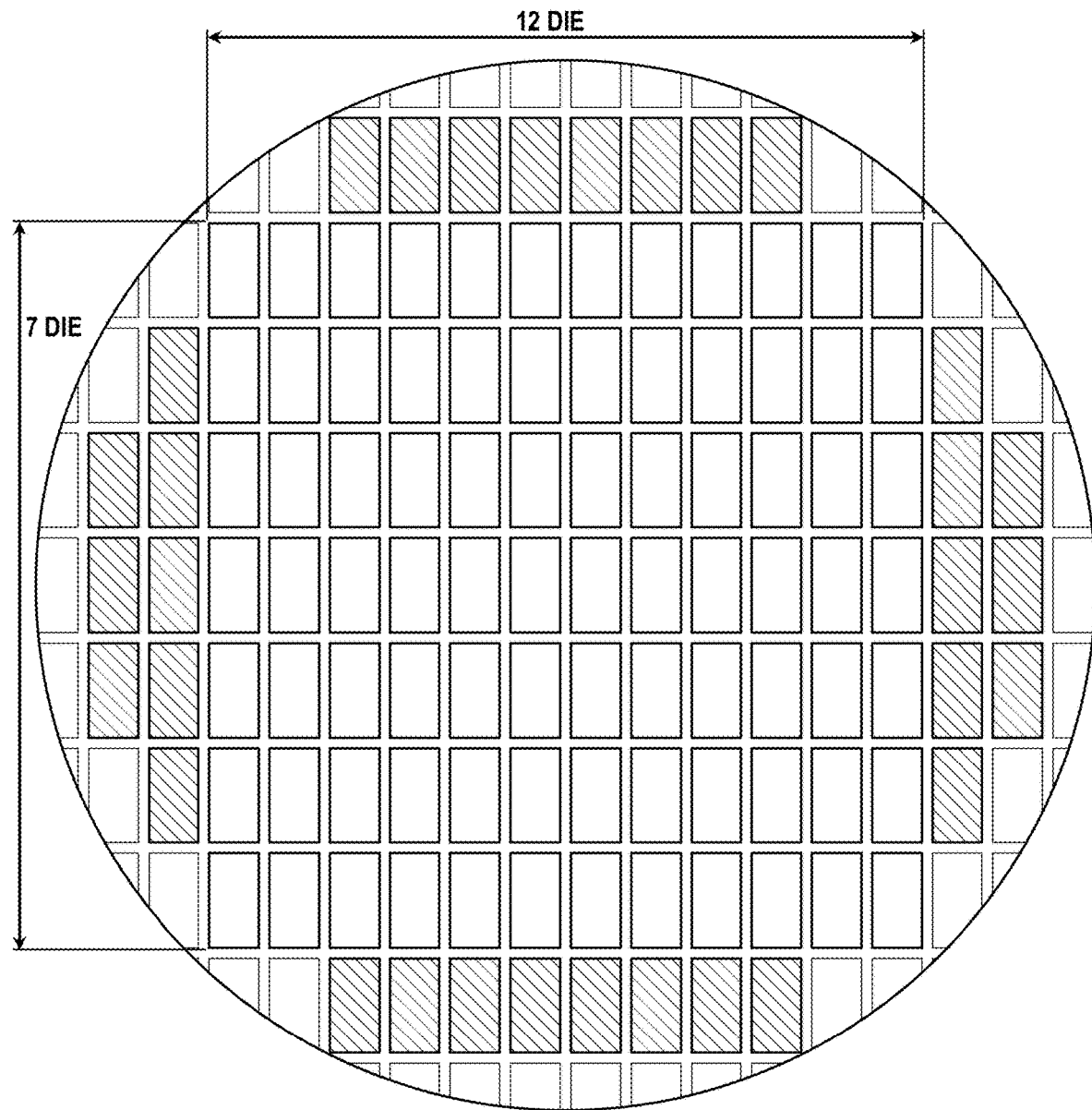
Figure 3C:
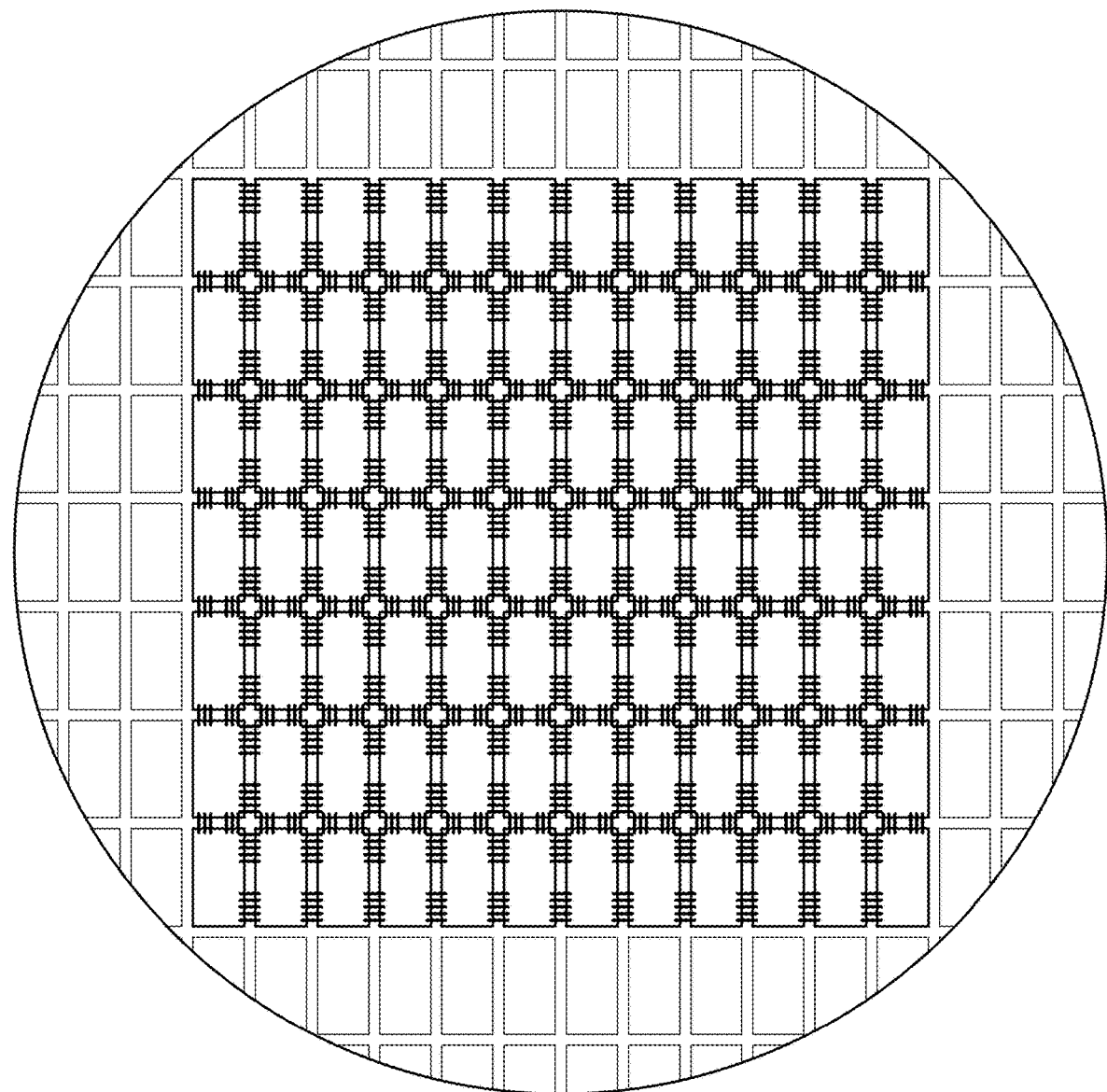
Figure 3D:
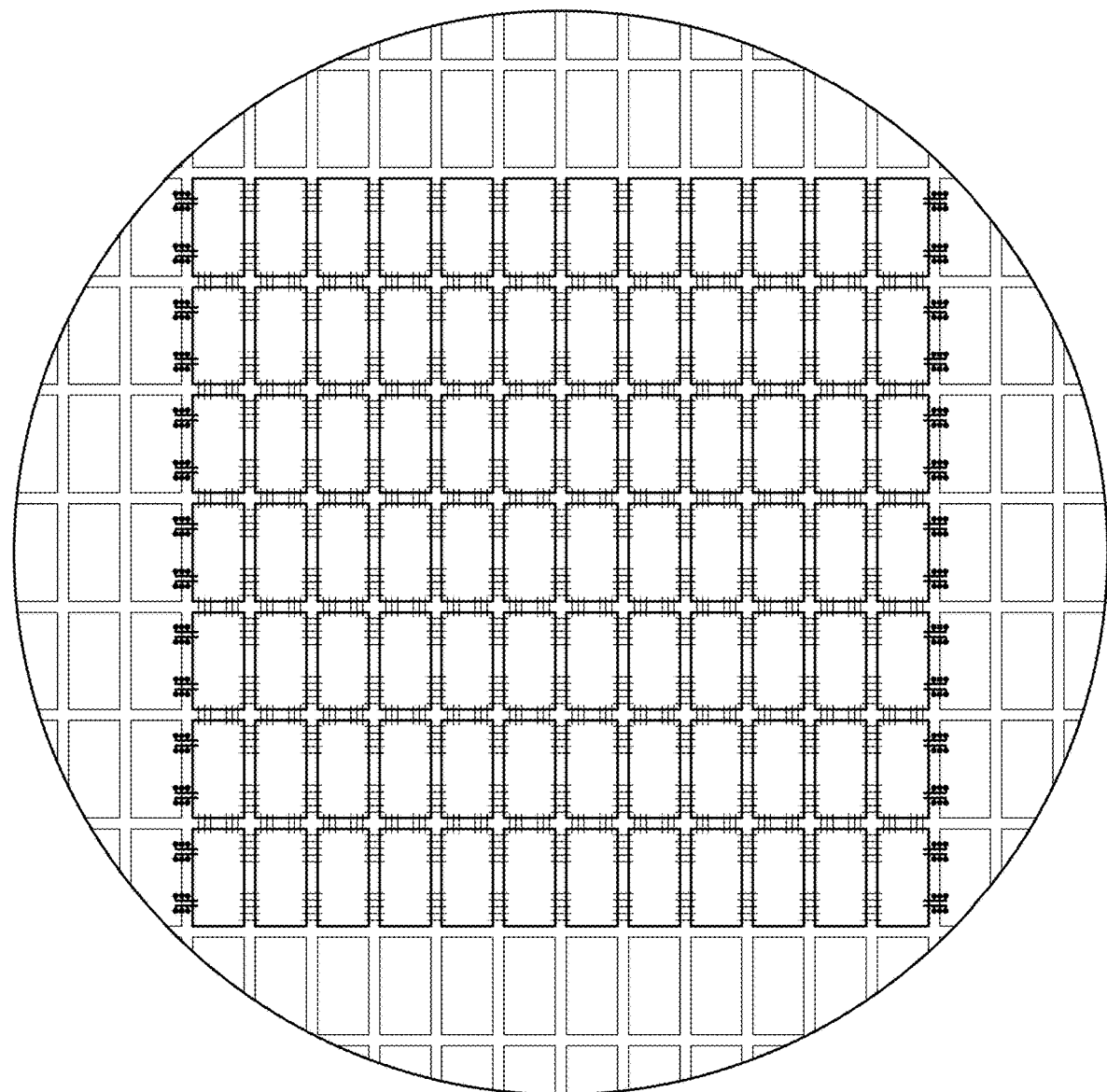
Figure 4A:
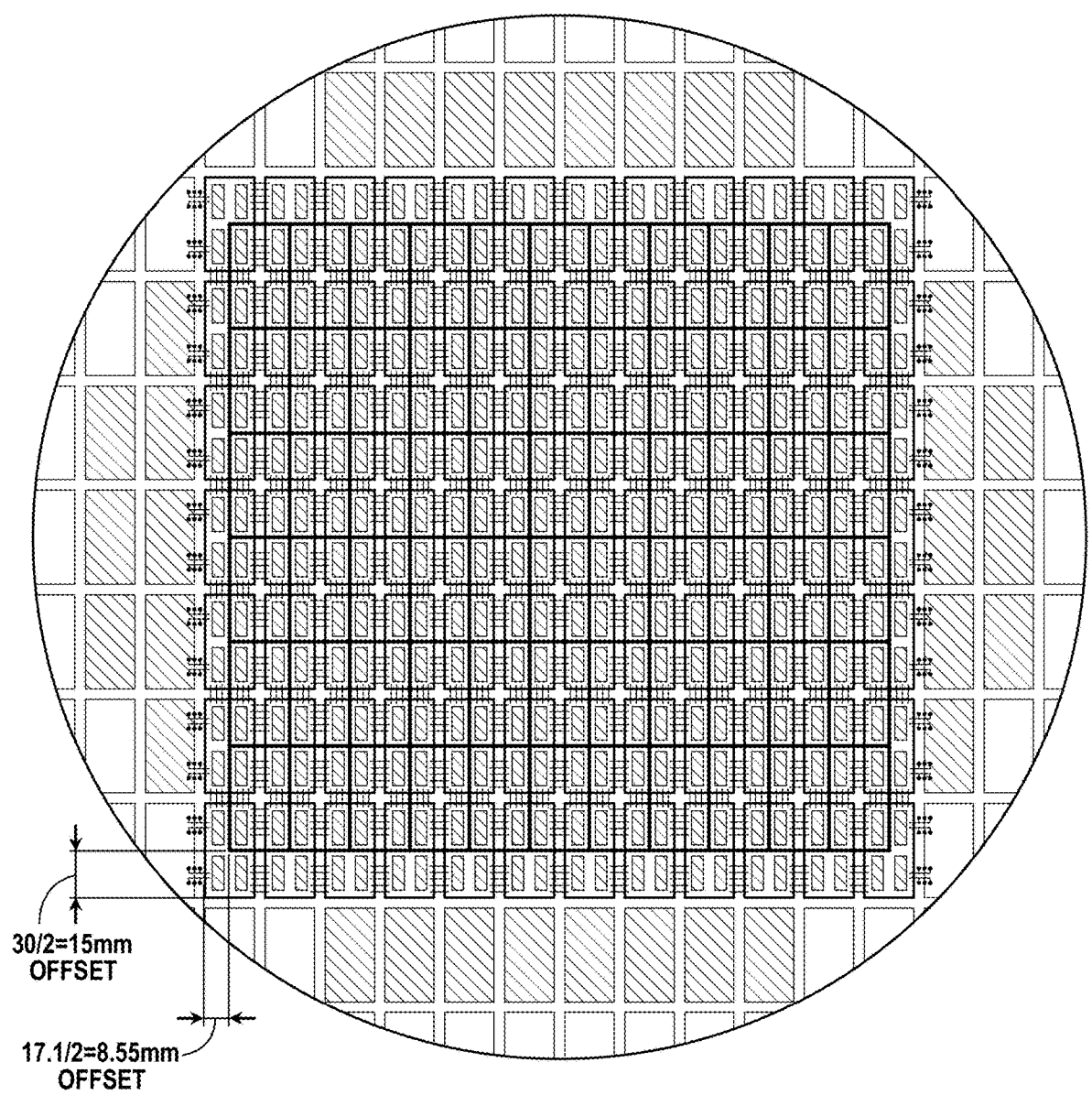
FIG. 4A-4D illustrate several schematics of a semiconductor substrate during exposure processes and size reduction in accordance with one or more embodiments of the present application.
Figure 4B:
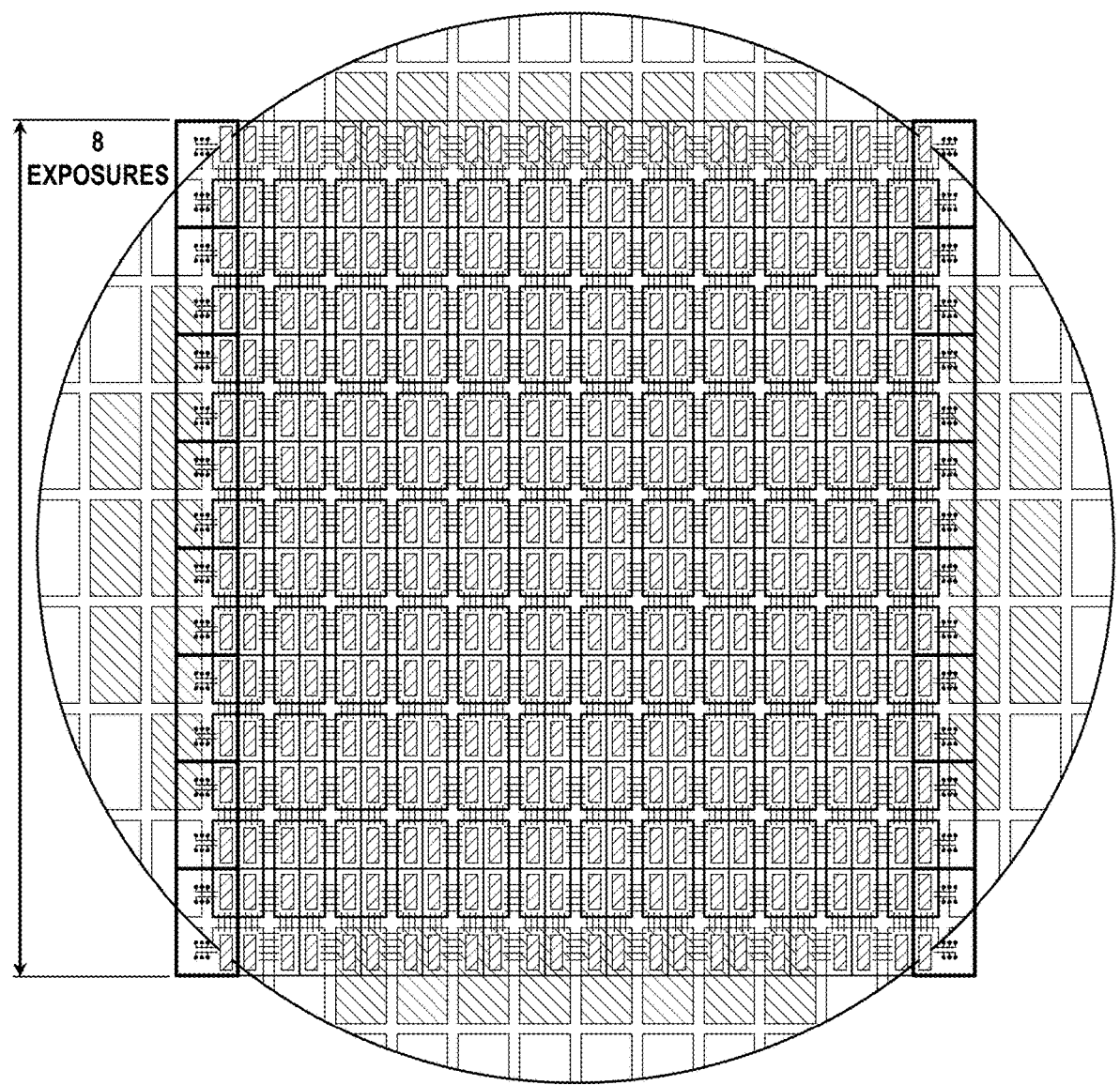
Figure 4C:
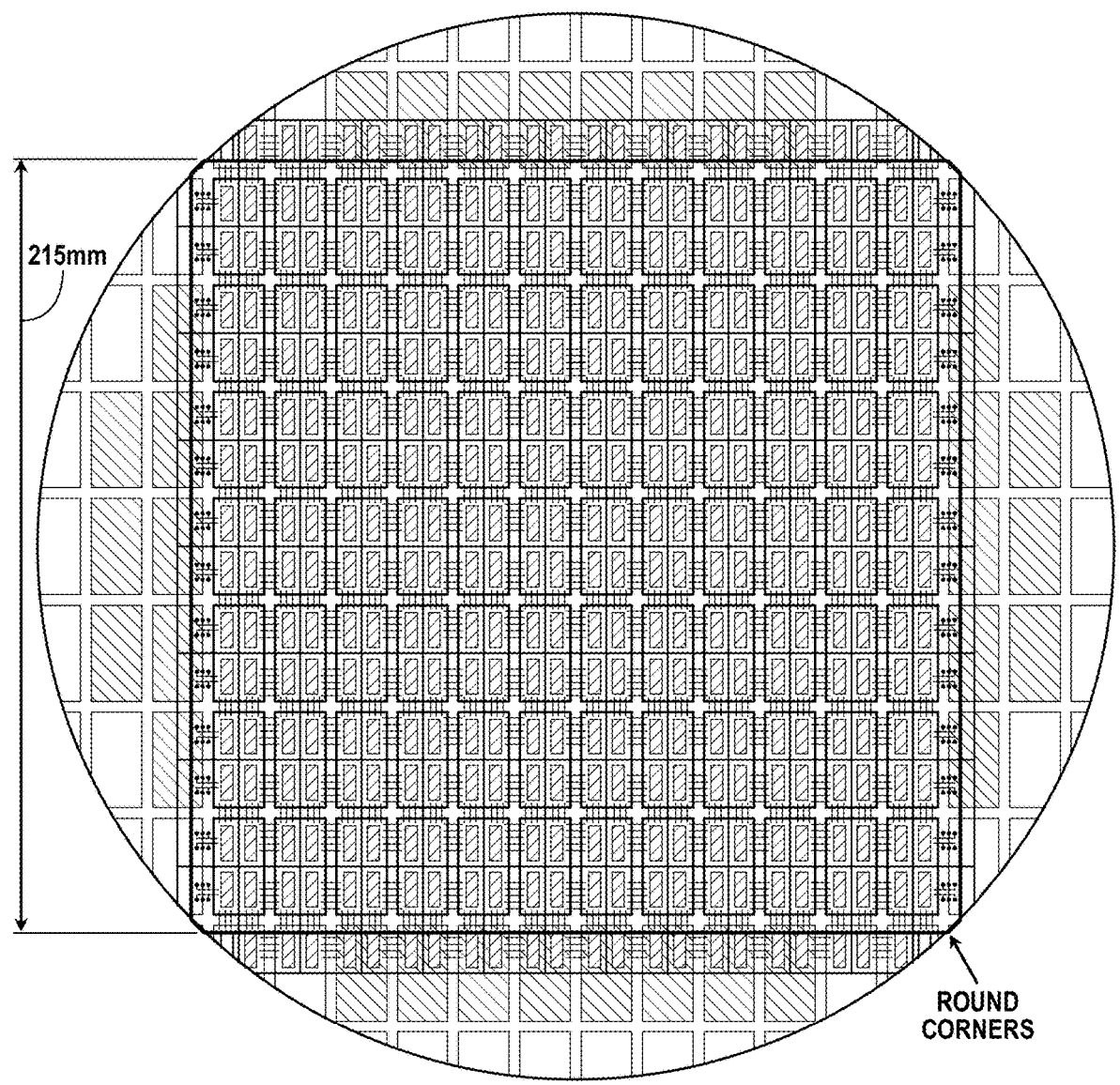
Figure 4D:
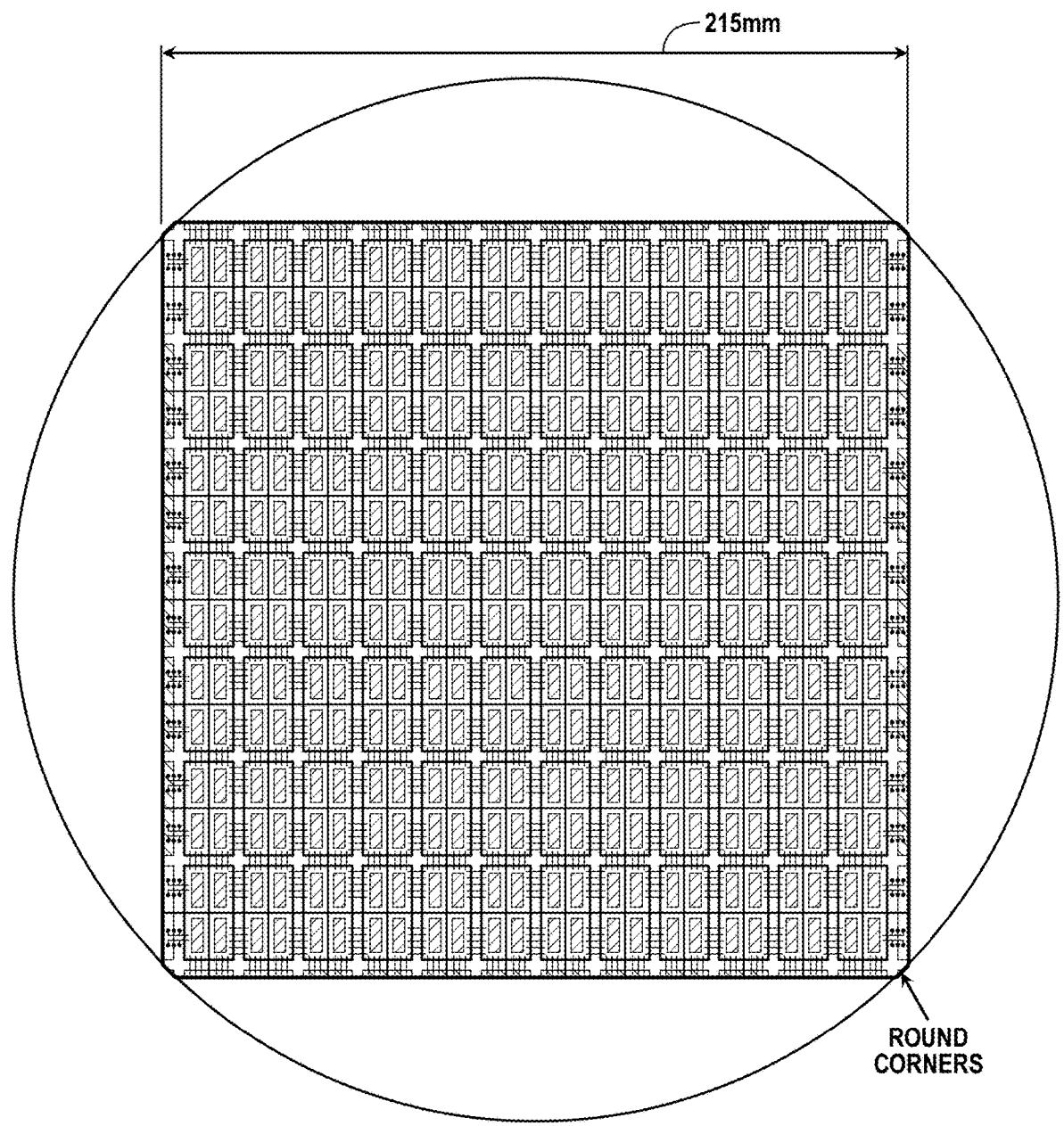

The following description of preferred embodiments of the present application are not intended to limit the inventions to these preferred embodiments, but rather to enable any person skilled in the art of to make and use these inventions.

1. Overview
1.1 Die Connectivity

Traditional integrated circuit manufacturers may prepare a single silicon wafer with many die formed on the silicon wafer. Once each die is formed on the silicon wafer, the integrated circuit manufacturer may then separate each die on the silicon wafer by physically cutting the wafer and having each die separately packaged into a chip. In some cases, the manufacturer may install several of those disparate or separate chips onto a same printed circuit board (PCB) to form an assembly and provide connections between the disparate chips so that they may communicate across the PCB assembly. The communication connections between the chips may typically be found in the PCB. However, when a multi-chip PCB is manufactured in this manner, the communication between disparate chips thereon becomes limited by the amount connectivity or bandwidth available in each connection between the disparate chips because the chips are in indirect communication via the PCB. The bandwidth across chips (e.g., off-chip communication) formed on separate pieces of silicon may be multiple orders of magnitude lower compared to chips that remain and communicate on a same piece of silicon or die.

The embodiments of the present application provide technical solutions that resolve connectivity, communication, and bandwidth issues of traditional integrated circuits and mainly, arising from integrated circuits manufactured on separate pieces of silicon (e.g., off-die integrated circuits). The technical solutions of the embodiments of the present application enable multiple die to be maintained on a same or single substrate (e.g., a wafer) without partitioning away each die in a wafer cutting process and further, while also establishing direct communication connectivity between adjacent die on the single substrate. Accordingly, the embodiments of the present application function to provide die-to-die connectivity on a single substrate or wafer.

The resulting substrate, however, has multiple die and consequently becomes a very large computer chip. Therefore, several technical problems relating to operational yield of the die on the large chip, packaging of the large chip, and powering/cooling of the large chip must also be solved. U.S. patent application Ser. No. 62/536,063 and U.S. patent application Ser. No. 16/019,882, which are incorporated by reference herein in their entireties describe technical solutions to these related technical problems.

1.2 Packaging and Coefficient of Thermal Expansion Mismatch

As alluded to in section 1.1, the fabrication of multiple die on a single substrate or wafer produces a very large die or resulting computer chip. While the connectivity of the multiple die to form a single large die on a single substrate and improved bandwidth across the substrate may be achieved according to the technical solutions described in U.S. patent application Ser. No. 62/536,063, the very large size of the resulting die then gives rise to many technical issues at the system level when packaging the very large die to a PCB, panel, or an organic substrate.

The embodiments of the present application, therefore, also provide a system and method for enabling large silicon die, like those described in section 1.1 and beyond, to be used in PCBs or organic substrates having a non-compliant coefficient of thermal expansion relative to the large silicon die.

The technical problem of CTE mismatch arises in the computer chip packaging process results from a difference in the CTE of silicon onto which an integrated circuit is fabricated and the CTE of the substrate (e.g., PCB) onto which the silicon is later attached. The mismatch in CTEs of the silicon and the PCB onto which the silicon is attached results in the expansion (when powered or heat applied) of the two materials at different rates, inducing mechanical stresses, which can lead to damage in the computer chip, usually while in use. In traditional chip packaging, it is only a single silicon die with circuitry that is attached to a PCB at a time and the relatively small size of the single silicon die may produce a small or negligible expansion mismatch with the PCB that the single silicon die is attached to. For instance, to attach a single silicon die to a PCB, small microbumps are added to a surface of the single silicon die then the silicon die is affixed to the PCB. When the single silicon die and the PCB expand at different rates due to differences in CTE properties of the materials, the microbumps can typically elastically deform and absorb the small shearing forces produced by the different expansions of the PCB and the silicon die. By contrast, when the silicon die is very large (e.g., includes multiple die), the microbumps are not capable of managing the large differences in expansion of the large silicon die and the PCB and thus, the microbumps will become damaged or cracked due to the excessive displacement of the silicon die relative to the PCB.

Additionally, in the case of a small silicon die, the PCB material may be selected such that the disparity between the CTE of the silicon die and the CTE of the PCB are reduced sufficiently for compatibility.

However, the large size of the silicon die of several embodiments of the present application exacerbates the problem of CTE mismatch. In some instances, the large silicon die described herein may be up to eighty or more times larger than a single silicon die and thus, the expansion of such a large silicon die may be compounded and the resulting expansion mismatch with a PCB onto which the large silicon die is attached is similarly compounded. Additionally, because the large silicon die may be so great, there are currently no materials that may be selected and combined to form a PCB and achieve CTE compatibility with the CTE of the large silicon die.

To address at least these technical problems, embodiments of the present application provide an elastomeric connector that is disposed between the large silicon die and a PCB or other substrate. The elastomeric connector may be capable of conducting a signal through it while placed under pressure of the system and may also be malleable. The malleability of the elastomeric connector allows for absorption of the shearing displacement between the large silicon die and the PCB. U.S. patent application Ser. No. 62/536,071 and U.S. patent application Ser. No. 16/029,207, which are incorporated by reference herein in their entireties describe technical solutions to these related technical problems.

1.3 Substrate Securing Mechanism

As introduced in section 1.2, a large elastomeric connector may be preferable for establishing a connection between a large wafer and a corresponding PCB (or panel). Specifically, one embodiment of the described elastomeric connector includes a large piece of silicon rubber that is malleable and having a plurality of conductive elements (e.g., conductive contacts) therein. The plurality of conductive elements in the elastomeric connector preferably contacts both the PCB and the wafer when the system when placed under a compression load thereby establishing signal connectivity between the PCB and the wafer.

The compression of the combination of the wafer, the elastomeric connector, and the PCB is preferably achieved over a large surface of the compression system; however, because the wafer is thin and may be composed of relatively delicate material, the application of the compression forces for establishing the signal connectivity and also, to secure together the wafer, the elastomeric connector, and the PCB must be carefully applied during assembly and further, maintained after the assembly of the integrated circuit. At least a uniform compression system is proposed by the embodiments of the present application to achieve a required overall system compression after assembly.

In related art or traditional assembly systems, there exist no such system designed for achieving this technical uniform compression. Rather, in traditional IC assemblies, a CPU is assembled to the motherboard by placing the CPU in a socket of the motherboard. Afterward, a large clamping structure may be used to apply a clamping force to maintain the position of the CPU within the motherboard and four screws and springs may be applied to secure the CPU to the motherboard around the periphery of the CPU. This traditional process is typically done under compression but the compression is only over particular surfaces of the motherboard and CPU system. A backing plate usually composed of a strong material, such as steel (or other strong metal), may be affixed to one side of the motherboard (or PCB) because as the system is clamped, the clamping forces generate large opposing compression forces onto specific sections of the IC assembly that causes the motherboard to bow. Accordingly, to compensate for the flexibility of the motherboard, a steel backing plate having significant height or thickness may be added to the system to support or prevent the motherboard from bowing. The backing plate has to extend outside the periphery of the IC to reach and accommodate the compressing screws and springs. The backing plate has to be stiffened, and therefore thickened, as the span of compressing screws is extended and/or as the IC size, and therefore IC perimeter, is increased. The backing plate, therefore, tends to add significant weight and size to the overall structure of the IC because of the thickness and frame width around the IC of the backing plate that is required to resist the clamping forces.

In the embodiments of the present application, because the wafer, elastomeric connector, and PCB are large, significant compression forces (e.g., up to 4 tons or more of compression) may be required to achieve proper assembly and maintained system compression. If a backing plate, as used in the traditional systems were implemented, the backing plate would bow greatly and thus, a significantly larger backing plate having double or more thickness in size than a traditional backing plate would be required to prevent the PCB and IC assembly from bowing. In addition to grossly overweighting the system and increasing the size of the system (e.g., height and area) of the system, such a large backing plate would make it difficult to power the integrated circuit as it would be difficult to provide a power supply structure through such a thick backing plate.

To address at least these technical problems, embodiments of the present application provide an assembly system that provides a substantially uniform compression force across the system (without introducing an overly thick backing plate), during an assembly step, and that further enables a continued uniform compression of the system after assembly of the integrated circuit that ameliorates the tensile forces acting on the PCB, that reduces the size and weight of the overall system, and that enables sufficient or ease of access to power the integrated circuit.

2. An IC with Inter-Die Connections and an Elastomeric Connector Assembly 2.1 IC with Inter-Die Connections As shown in FIG. 1, a semiconductor 100 illustrates an example integrated circuit having a substrate 110, a plurality of die 120 formed with the substrate 110, a circuit layer 125, a plurality of inter-die connections 130, and scribe lines 140.

The semiconductor 100 may be manufactured using any suitable lithography system that is configured to implement the one or more steps of the methods described herein, including method 200.

The semiconductor 100 functions to enable inter-die communications between the plurality of die 120 formed with the single substrate 110. The inter-die connections 130 formed between adjacent die on the substrate 110 improves communication bandwidth and enables a reduction in communication latency between connected die on the substrate 110 because communication between each of the plurality of die 120 is maintained on a same large die (e.g., on-die communication). That is, the inter-die connections 130 formed between the plurality of die 120 effectively eliminate a need to for a first die of the plurality of die 120 to go off-die (which increases latency due to transmission of signals using an intermediate off-die circuit) to establish communication with a second die of the plurality of die 120 since the first and the second die may be directly connected with one or more inter-die connections or, at a minimum, indirectly connected via intermediate inter-die connections established between one or more die between the first and the second die. Such configuration(s), therefore, enable(s) increasedly faster communications and data processing between die when compared, at least, to communications between die not maintained on a same substrate (e.g., a same wafer). Each of the plurality of die 120 remain on the single substrate 110 and are not cut from the substrate 110 into individual dice for separate packaging into an individual computer chip. Rather, at formation, only excess die (e.g., die that are not provided with circuitry or inactive die) along a periphery of the substrate 110 are preferably removed from the substrate 110 and the remaining portions of the substrate 110 having the plurality of die 120 (e.g., active die) may form a predetermined shape (e.g., a rectangular shape) with the substrate 110. The resultant substrate 110 after being reduced to shed excess die and potentially following one or more additional refinement or IC production processes may then be packaged onto a board (e.g., a printed circuit board (PCB) or a substrate).

The substrate 110 is preferably a wafer or a panel into and/or onto which die having a circuitry layer 125 on which microelectronic devices may be built. The circuitry layer typically defines one or more surfaces on a die onto which circuits and various microelectronic devices may be fabricated using a lithography system. The substrate 110 is preferably formed of a silicon material (e.g., pure silicon), but may be additionally or alternatively formed of any suitable material including silicon dioxide, aluminum oxide, sapphire, germanium, gallium arsenide, an alloy of silicon and germanium, indium phosphide, and the like. The substrate 110 may be a virgin wafer. Alternatively, the substrate 110 may include one or more layers formed therein where the one or more layers may include, but not limited to, a photoresist, a dielectric material, and a conductive material. The photoresist being light-sensitive material may include any material that may be patterned by a lithography system. The photoresist may be positive photoresist or negative photoresist.

Accordingly, the substrate 110 may be formed of any thin slice of semiconductor material that may be used for fabrication of integrated circuits having varying diameters and shapes, but preferably the substrate 110 is formed in a circular shape and with a diameter of 300 mm.

The lithography system may refer to any lithography system that prints images of a reticle onto a substrate (e.g., a wafer) using light. The lithography system may be a scanning projection system or a step and scan system, which may be alternatively referred to as a scanner or a stepper. The lithography system may include any suitable exposure system including one or more of optical lithography, e-beam lithography, X-ray lithography, and the like.

The microelectronic devices, such as transistors, diodes, various circuits, and the like may be formed into and/or over the substrate 110 using lithographic processes (e.g., optical lithography, etc.).

Each of the plurality of die 120 may be a block of semiconducting material on which circuits may be fabricated. Each of the plurality of die 120 may be formed by an exposure process of silicon material of or on the substrate 110 and typically in a rectangular shape or square shape. However, it shall be noted that the die 120 may take on any suitable form including any geometric and non-geometric forms. Other than excess die that is removed from the substrate 110 during a substrate reduction process, the plurality of die 120 are not cut or diced from the substrate 110 into individual dice.

Additionally, each of the plurality of die 120 includes an alignment point preferably at a center of each die. The alignment point may be used by the stepper of the lithographic system to align the photomask and/or photoreticle with respect to each of the plurality of die 120 before an exposure process. Further, each of the plurality of die 120 may include a seal ring surrounding or covering a periphery (perimeter) of each of the die other than the circuitry layer (e.g., circuit fabrication surface) of each dice. Accordingly, the seal ring may be provided at the side surfaces of each dice which extend in a normal direction (i.e., perpendicular) with respect to the surface of the substrate 110 and further, located adjacent scribe lines 140. The seal ring functions to protect each dice from various contaminants or particulates that may potentially impregnate or enter a dice.

The plurality of inter-die connections 130 function to connect, at least, any two circuits (e.g., the inter-die connections may connect a transmitting circuit and receiving circuit of two die, respectively) between two die of the plurality of die 120 on the substrate 110. That is, each inter-die connection 130 may be formed or provided to extend from a first dice to a second dice located on the substrate 110. Preferably, an inter-die connection 130 may be formed between two adjacent die. Each inter-die connection may be formed of a material having a length and an endpoint at each respective end of the length of material (e.g., two endpoints), where each respective endpoint terminates at a circuitry layer of a different dice on the substrate 110.

In the case that the die are formed in a rectangular or similar geometric or substantially geometric shape, the inter-die connections 130 may extend between two parallel or substantially parallel surfaces of the two-adjacent die. Accordingly, it is possible for a single dice of the plurality of die 120 to be connected to more than one dice depending on the positioning of the dice in the array of die on the substrate 110. When positioned in an interior of the substrate 110, the single dice of the plurality of die 120 may be adjacent to four other die having at least one surface that is parallel to one of the four side surfaces of the single dice where one or more inter-die connections 130 may be formed. It shall be understood that while in preferred embodiments it is described that the die may be formed as a rectangle (or other polygon), the die may be formed in any shape or manner suitable for preparing an integrated circuit including non-traditional, non-geometric or non-polygonal shapes.

The plurality of inter-die connections 130 (global wires) are preferably wires or traces that function to conduct signals across two die. The plurality of inter-die connections 130 are preferably formed of a same conductive material used to form intra-dice connections (or local wires) between circuit elements of a single dice. Additionally, or alternatively, the plurality of inter-die connections 130 may be formed of any suitable conductive material that may be the same or different from materials forming other wires on a dice or that may be the same or different from materials forming the circuits on the dice.

In a preferred embodiment, the plurality of inter-die connections 130 are formed by offsetting the stepper of a lithographic system a predetermined distance from a center or alignment point of a single dice sufficiently to allow an exposure to be performed for and between two adjacent die rather than an exposure focusing on the circuitry layer 125 of an individual dice. Consequently, the exposure(s) that provide the inter-die connections 130 may be formed over the scribe lines 140. Additionally, the endpoints of an inter-die connection 130 may be positioned or formed at interior position relative to a location of the seal ring of a dice. Accordingly, while the inter-die connections 130 may be formed at any suitable location between two die, the inter-die connections may be typically formed such that the respective endpoints of an inter-die connection 130 are positioned inwardly of the seal ring of the dice on which it terminates such that each respective endpoint of an inter-die connection 130 is positioned at some location between the seal ring and a center of the respective dice.

The scribe lines 140 (or saw street) function to indicate a location between two disparate die on the substrate 110 where the substrate 110 would typically be cut for forming individual dice. The scribe lines 140 may typically be centered between two or adjacent die and in many cases, have a width similar to a width of a saw used for cutting wafers and the like. In a typical circumstance, no circuitry or other elements would be formed on or over the scribe lines 140, as these elements would most likely be severed or damaged during a cutting process of the substrate 110.

As shown in FIG. 2, a method 200 for producing a large semiconductor having a plurality of die and a plurality of inter-die connections includes providing a semiconductor substrate S210, fabricating one or more circuitry layers on a plurality of die of the substrate S220, fabricating a plurality of inter-die connections S230, and reducing a size of the semiconductor substrate. The method 200 may optionally or alternatively include identifying a largest square of the substrate S215 and providing a protective barrier encompassing portions of the plurality of die S225.

Further, FIGS. 3A-3D illustrate several schematics of a semiconductor substrate, such as semiconductor 100, without and with interconnections. FIGS. 4A-4D illustrate several schematics of a semiconductor substrate, such as semiconductor 100, during exposure processes and size reduction.

2.2 Elastomeric Connector Assembly

Figure 5:
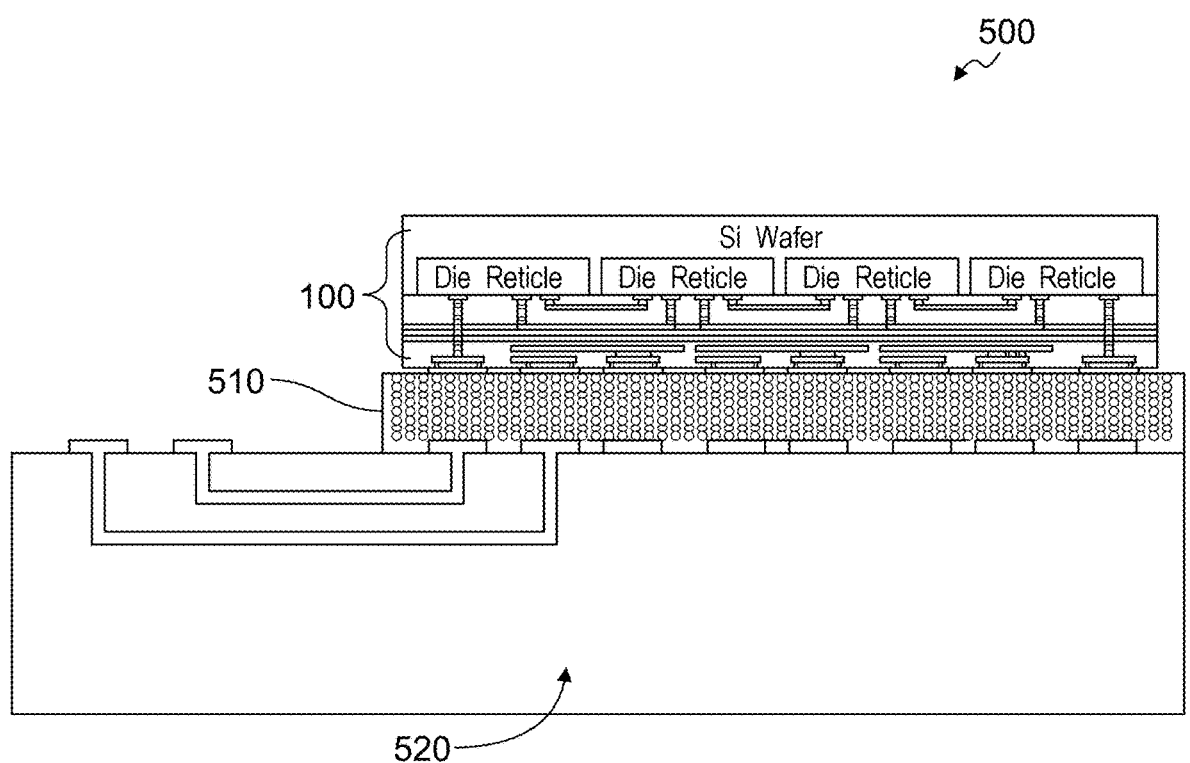
FIG. 5 illustrates a semiconductor assembly 500 in accordance with one or more embodiments of the present application.

As shown in FIG. 5, a semiconductor assembly 500 illustrates an elastomeric connector 510 disposed between the semiconductor 100 and a circuit board 520.

The elastomeric connector 510 functions to secure the large semiconductor 100 to a circuit 520. The elastomeric connector 510 preferably functions to place the semiconductor 100 and circuit board 520 in operable signal communication by conducting signals between them in a vertical direction (a direction normal to surfaces of both the semiconductor 100 and circuit board 520). Specifically, each of the semiconductor 100 and the circuit board 520 may include one or more conductive pads. The conductive pads of the semiconductor 100 may generally oppose the conductive pads of the circuit board 520 and may also, have a one-to-one alignment with each other. The elastomeric connector 510 is designed to be interposed between the opposing surfaces of the conductive pads of both the semiconductor 100 and the circuit board 520. In this way, signals provided by a conductive pad of either the semiconductor 100 or the circuit board 520 may be transmitted through the elastomeric conductor 510 to an opposite conductive pad of the other of the semiconductor 100 and the circuit board 520.

Figure 6A:
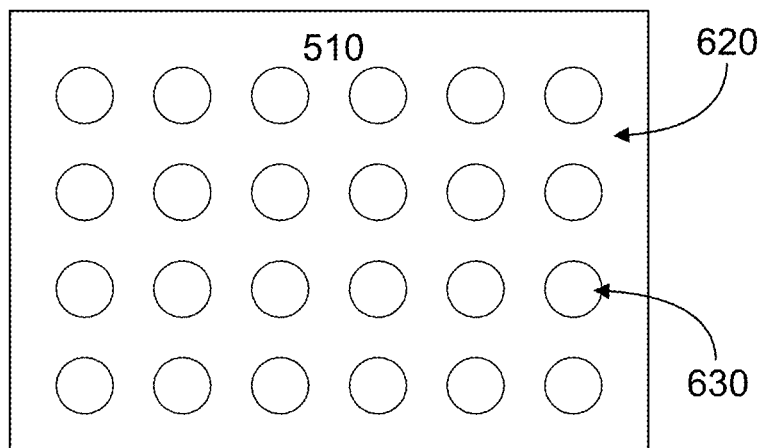
FIG. 6A-6B illustrate schematic examples of an elastomeric connector in accordance with one or more embodiments of the present application.

As shown in FIG. 6A, the elastomeric connector 510 includes a membrane 620 having a plurality of conductive elements 630. The membrane 620 may be any suitable material but is preferably made using silicon material.

Figure 6B:
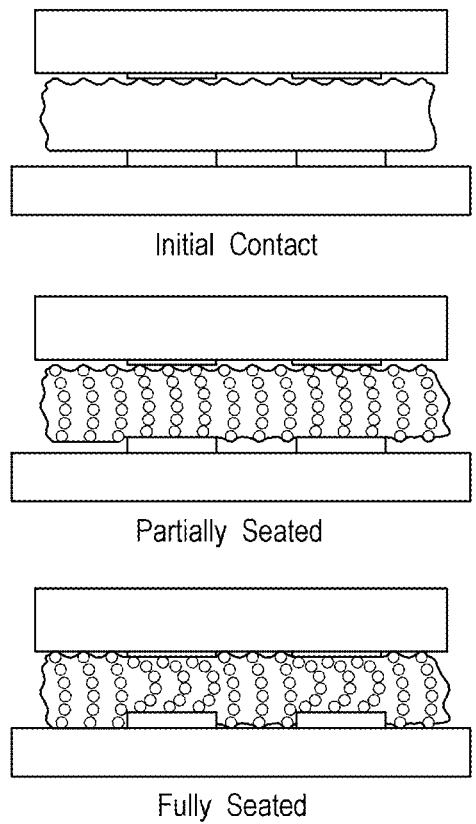

The plurality of conductive elements 630 may be any suitable conductive material that are arranged distributively within a body of the membrane 620. The plurality of conductive elements generally include a plurality of particles, such as ball wires, that when placed under compression (e.g., vertical compression) come into conductive contact with adjacent particles. As shown in FIG. 6B, when under compression, the plurality of conductive elements 630 only make contact vertically and not horizontally.

The plurality of conductive elements 630, additionally, function to provide an elastic effect or spring effect in one or more portions of the elastomeric connector 510. Accordingly, when one or more portions of the elastomeric connector 510 is placed under a load, the plurality of conductive elements 630 may elastically compress without allowing the elastomeric connector 510 to undergo permanent deformation. That is, even after a large load (e.g., four tons of pressure or the like) the plurality of conductive elements 630 are sufficiently elastic to allow the elastomeric connector 510 to regain its original form or substantially its original form when the elastomeric connector 510 is not placed under the large load.

In the case that the plurality of conductive elements 630 comprise ball wires, the elastic effect is achieved when a load is placed onto the elastomeric connector 510 thereby causing the ball wires to come into conductive and elastic contact with each other. The ball wires when in contact form a substantially vertical conductive path and additionally, a vertical spring or elastic in which the adjacent ball wires forming the vertical conductive path and spring are permitted to slide against each other in a horizontal direction (e.g., in a direction normal to a direction of a load) and in the vertical direction (albeit slightly) while maintaining continuous contact. The sliding of ball wires adjacent to each other in the conductive and elastic path allows the conductive and elastic path to shift (while maintaining conductive and elastic contact) and form an arc. The arc formed by the ball wires while under a compressive load may have varying radii along the arc. Additionally, the arcs formed by horizontally adjacent vertical conductive and elastic paths may have similar or different arcs depending on an amount of load applied thereon.

Further yet, the plurality of conductive elements 630 while under compression and while maintaining conductive contact function to enable a shearing force absorption effect while maintaining signal conductivity between the semiconductor 100 and the circuit board 520. A shearing effect or shearing force against the elastomeric connector 510 may generally be caused by a disparity between the CTE of the circuit board 520 and the semiconductor 100. The semiconductor 100 being preferably made of silicon material typically does not vary greatly, in terms of expansion (expands approximately at 3 parts per million) or contraction, during heating or cooling. The circuit board 520, however, which may include materials such as copper may expand and contract at a different rate (e.g., 17 parts per million). Of course, because the semiconductor 100 is large the corresponding circuit board 520 is large so that a heating effect (when powered) applied to the assembly 500 may mainly causes the circuit board 520 to expand so greatly relative to the semiconductor 100 on the opposite side of the elastomeric connector 510 to cause to a large shearing force and resulting shearing effect on the connector 510.

However, as mentioned above, the configuration of the ball wires (e.g., roundness or substantial roundness) allows the balls to shift or slide against each other and thereby absorb and resist the shearing force caused due to the heating of the circuit board 520 and the semiconductor with mismatched CTEs.

Figure 7:
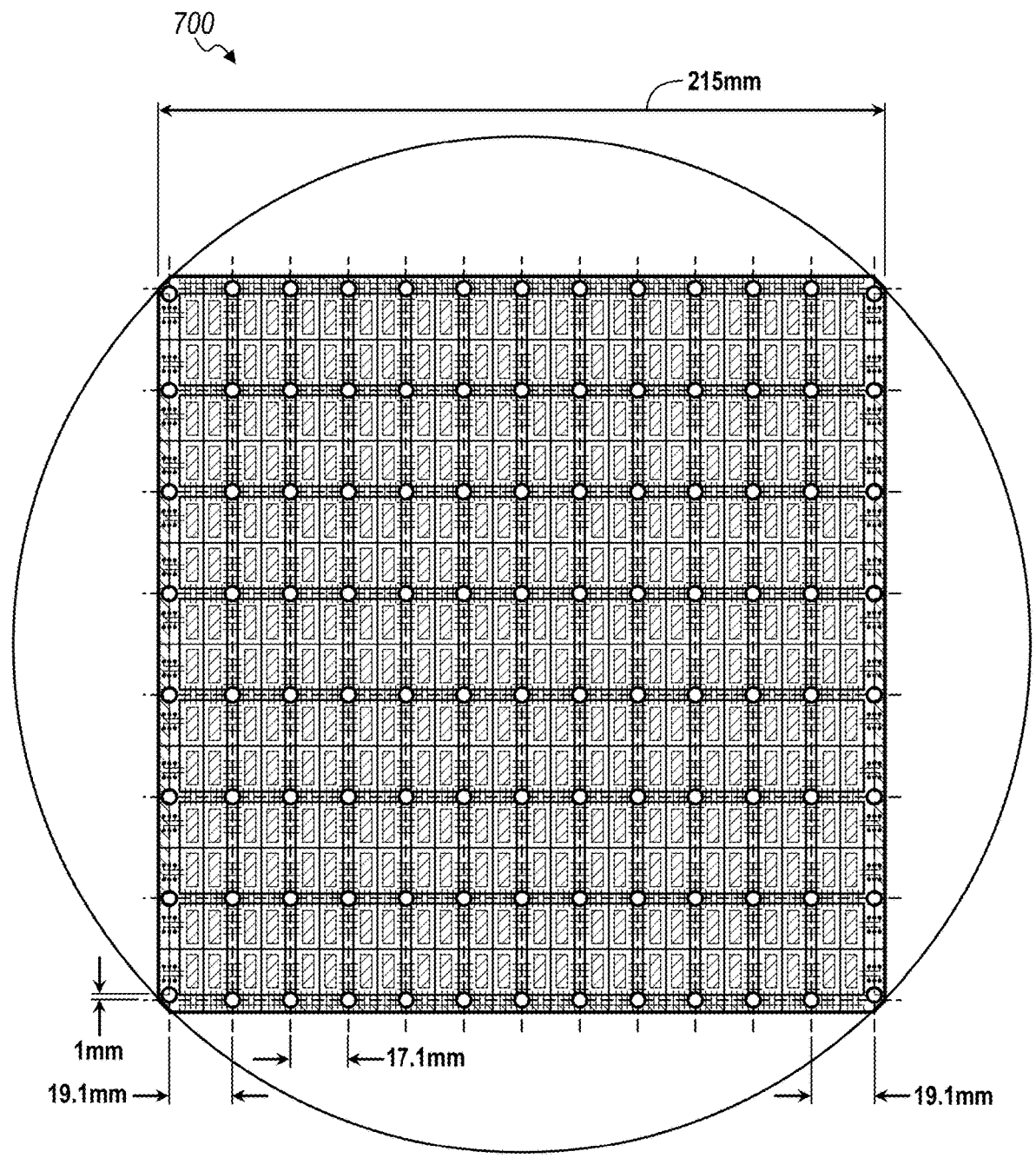
FIGS. 7-7A illustrate schematics of a large substrate in accordance with one or more embodiments of the present application.
Figure 7A:
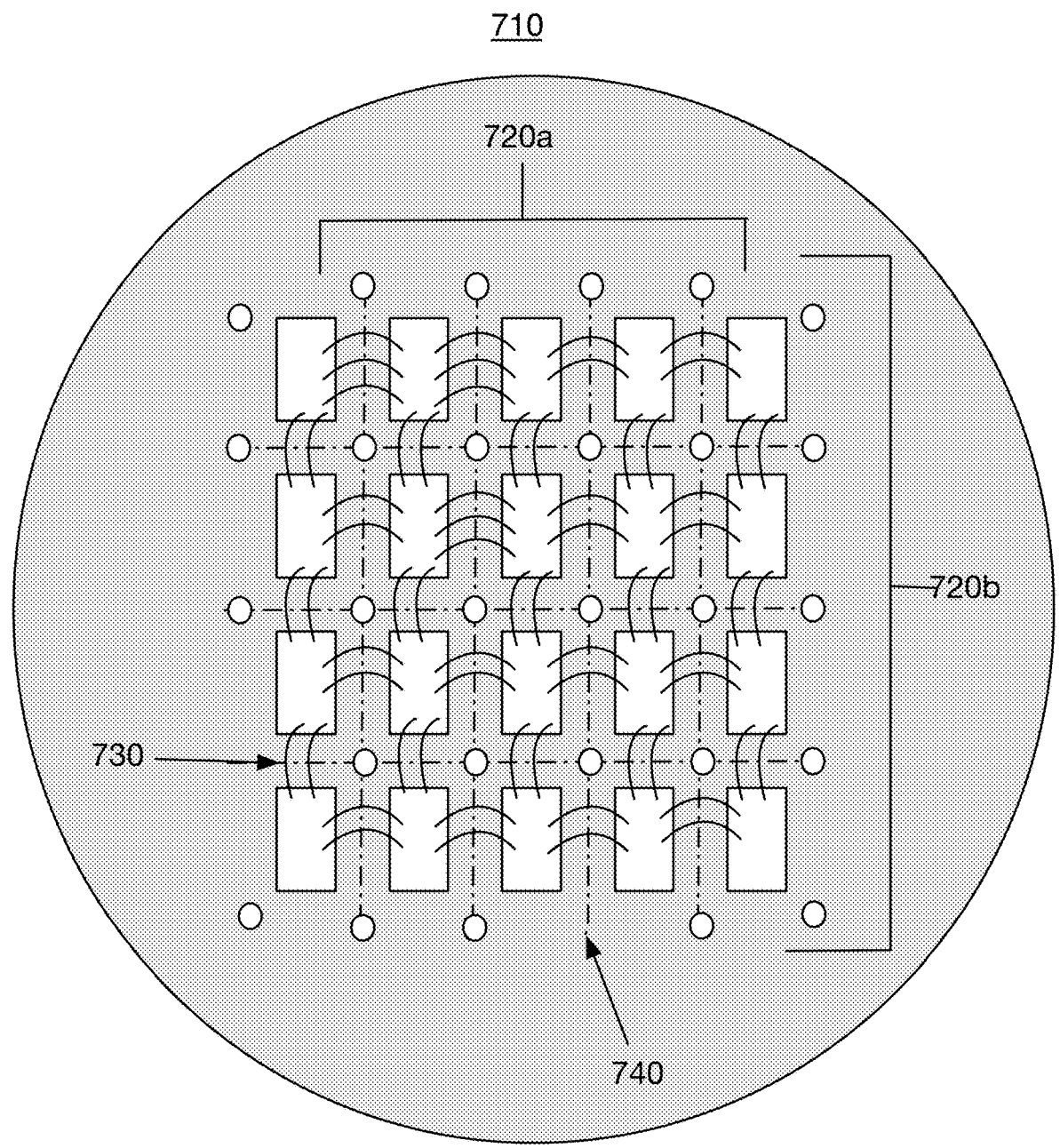
Figure 8:
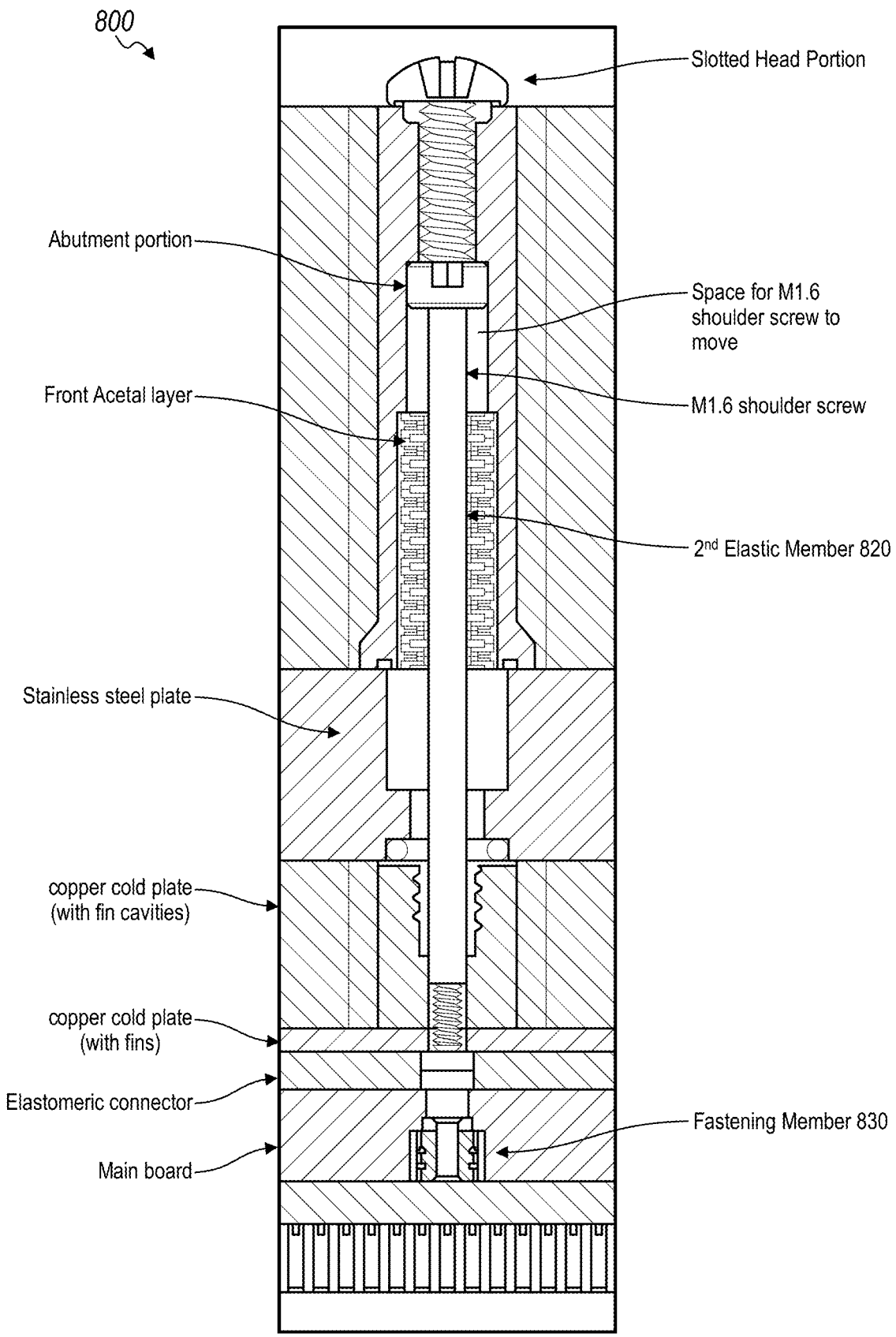
FIG. 8 illustrates a schematic of a securing element 800 in accordance with one or more embodiments of the present application.

3.0 Systems and Methods for Securing an IC Assembly
3.1 An Array of Orifices for Securing the IC Assembly Referring to FIGS. 7-7A, FIGS. 7-7A illustrate a large substrate 710 (e.g., a large wafer) designed with a plurality of die having inter-die connectivity. In some embodiments, the large substrate 710 may have a same or similar configuration as the substrate 110 described with respect to FIGS. 1-2 of the present application.

Figure 10A:
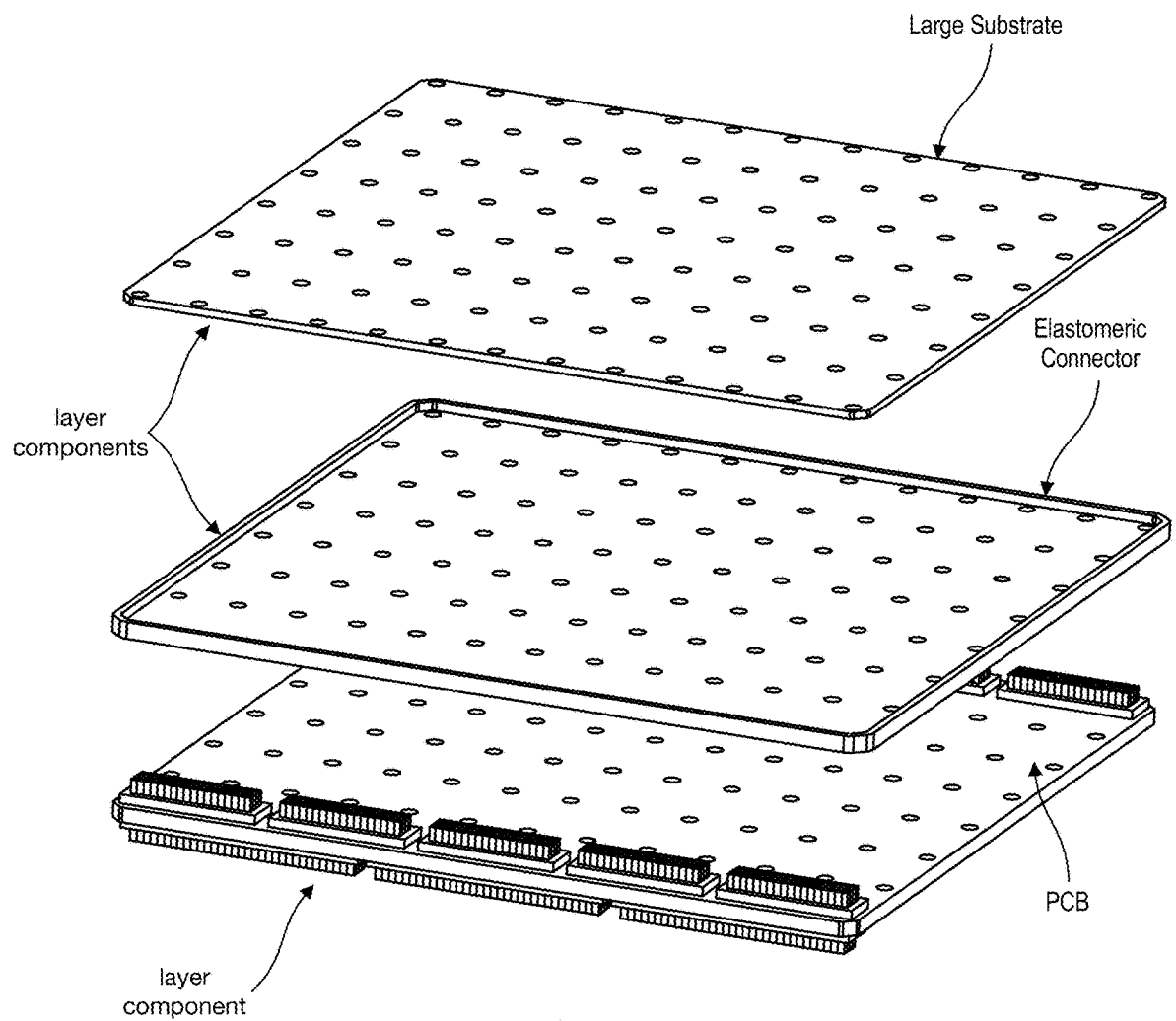
FIGS. 10A-C illustrate a first, second, and third example of some components of an IC assembly in accordance with one or more embodiments of the present application, respectively.
Figure 10B:
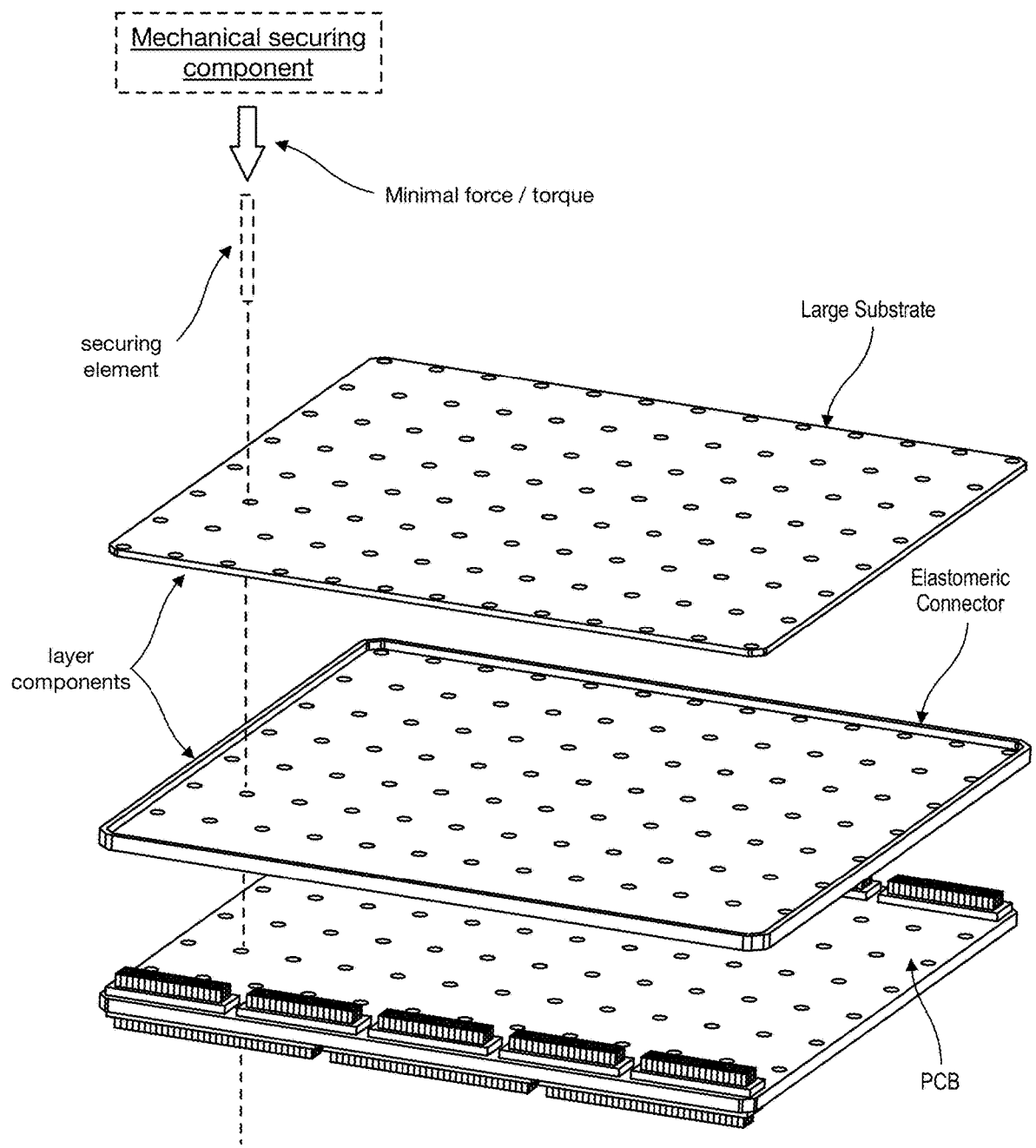
Figure 10C:
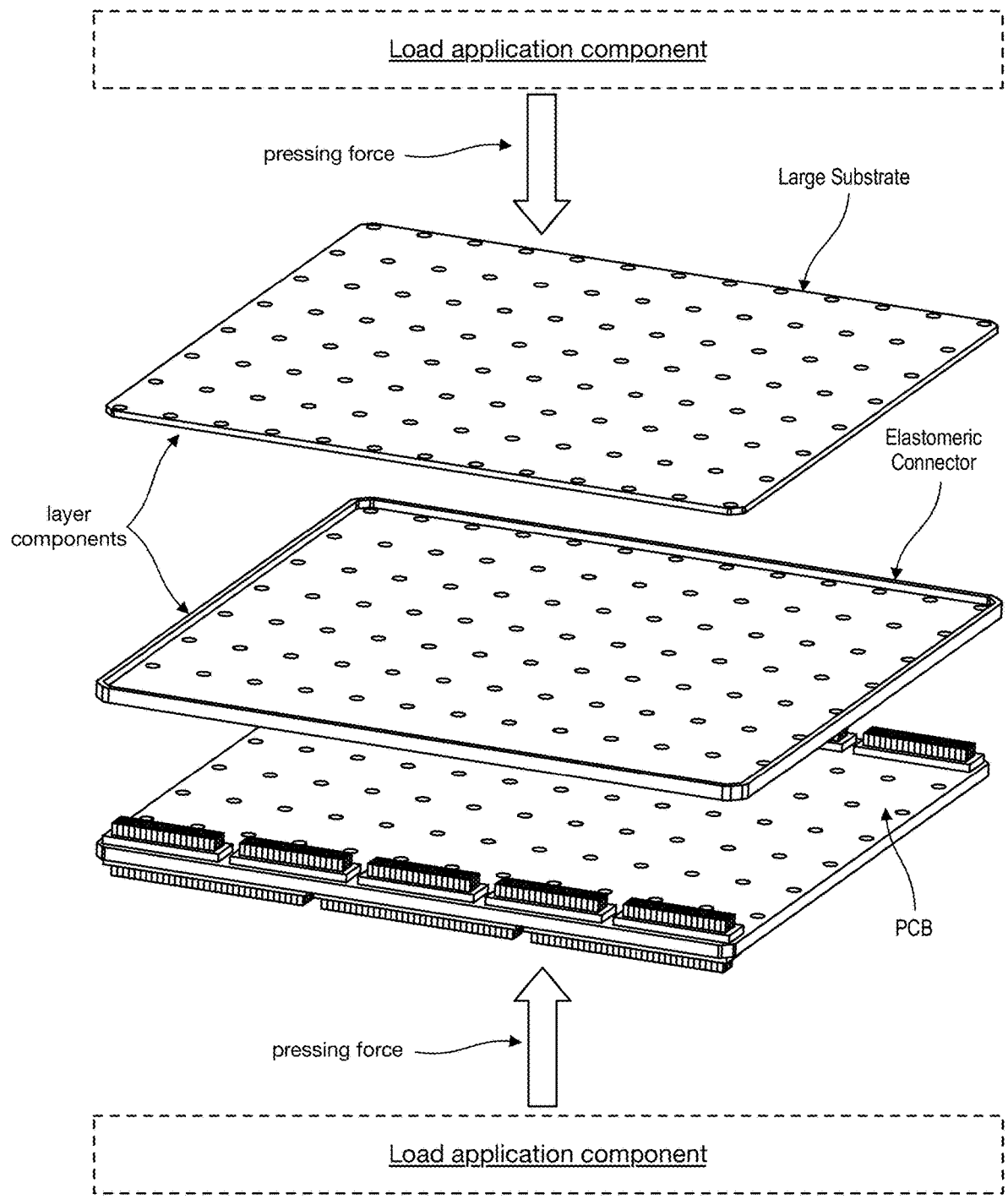

The large substrate 710 may be configured with a plurality of orifices 720 distributed across a surface of the large substrate 710. Preferably, the orifices 720 are fabricated within each layer of an integrated circuit assembly that includes the large substrate 710. The plurality (or array) of orifices 720 may be centered based on a center of the large substrate 710. The plurality of orifices 720 may include a plurality of through holes and/or cavities fabricated within one or more layers of an IC assembly. The configuration of the plurality of orifices 720 may depend on the material and a position of the material in the IC assembly, as shown in FIG. 10, in which a respective orifice 720 is formed. For instance, within the large substrate 710, each of the plurality of orifices 720 may be a through hole that is configured to receive a securing element 800. In another example, within a PCB or panel forming an assembly component of the IC assembly, the plurality of orifices 720 may define a plurality of cavities configured to receive a terminal end of the securing element 800. That is, within the PCB or panel may be included a fastening member (e.g., an embedded nut or the like) that is configured to receive a terminal end of a securing element 800 and securedly attach the securing element 800 within a cavity of the PCB or panel; meaning that, in such embodiments, a through hole may not be formed with the PCB or panel that enables the terminal end of the securing element 800 to pass through the PCB or panel.

Additionally, or alternatively, the plurality of orifices 720 may be defined by a combination of intermediate orifices 720a and periphery orifices 720b. Referring to FIG. 7, the intermediate orifices 720a may include an array of orifices positioned along the substrate 710 between a left lateral column of periphery orifices 720b and a right lateral column of periphery orifices 720b. Each of the intermediate orifices 720a is preferably positioned at a respective corner of a die of the substrate. In some embodiments, at interior position of the substrate, a respective intermediate orifice 720*a* may be positioned at a respective corner of at least four die. That is, four die may share a respective intermediate orifice 720*a* at one of their respective corners. The intermediate orifice 720*a* may be positioned on the substrate 710 such that the orifice abuts the corner of the die. Alternatively, the intermediate orifice 720*a* may be disposed with a slight gap between itself and the die to avoid damage to the die either during the fabrication of the intermediate orifice 720*a* or during the process of securing the IC assembly components together with a securing element 800 or the like.

Additionally, or alternatively, the plurality of orifices 720 (including intermediate and periphery orifices) may be positioned or centered on the scribe lines 730, 740 of the substrate 710. That is, in some embodiments, a scribe line may run along a line defining a diameter of each respective orifice 720. In the case of the intermediate orifices 720*a*, each intermediate orifice 720*a* may be positioned at corners of a plurality of die while being centered at an intersection of scribe lines 730, 740. Accordingly, an intersection of a vertical (740) and a horizontal scribe line (730) should define a center of intermediate orifice 720*a*. Positioning the plurality of intermediate orifices 720*a* in this manner along the scribe lines and at the corner of the die functions to avoid any logic circuitry that may be positioned along the scribe lines 730, 740 and between pairs of die. In many embodiments, the logic provided to the substrate 710 are preferably not formed at the corner areas of the die of the substrate 710.

Additionally, with respect to the intermediate orifices 720*a*, the distance or pitch between any two pair of intermediate orifices 720*a*, along a given direction, on the substrate 710 should be the same. For example, each pair of intermediate orifices 720*a* along a horizontal direction of the substrate 710 may be a predetermined pitch of 17.1 mm or the like, for example. The pitch would measure a distance between each respective center of the pair of intermediate orifices 720*a*. Similarly, along a longitudinal direction of the substrate 710, the predetermined pitch between intermediate orifices 720*a* may be a predetermined pitch of 30.0 mm or the like. The predetermined pitch between pairs of orifices enables to a scalable configuration of a tool and/or machine used to insert a plurality of securing elements 800 within the substrate 710 at a same time.

The periphery orifices 720*b* are preferably defined by the outermost lateral columns of orifices of the substrate 710. The periphery orifices may function to laterally encapsulate the intermediate orifices 720*a*. Additionally, or alternatively, the periphery orifices may be disposed such that the pitch between a pair of orifices defined by a single intermediate orifice 720*a* and a single periphery orifice 720*b*, along a horizontal direction with respect to the substrate 710, is larger than the predetermined pitch between a pair of intermediate orifices 720*a*. For instance, the pitch, in the horizontal direction, between a mixed pair of orifices may be a predetermined pitch of 19.1 mm rather than 17.1 mm.

Additionally, the predetermined pitch between the pairs of intermediate orifices 720*a* and the mixed pair of orifices may be designed specifically to reduce a tensile force applied to a PCB and/or backing element (e.g., a backing plate, cooling plate, etc.) when the IC assembly components are clamped together. Specifically, the predetermined pitch for the pairs of orifices are preferably positioned sufficiently close to avoid unnecessary tensile stress to the PCB and backing element components of the IC assembly. In this way, bowing of the PCB and the backing element may be avoided during compression of the IC assembly. Otherwise, if a larger pitch is used, a larger backing element may be required to resist the tensile stress of compression and to further prevent bowing of the PCB and backing element.

3.2 Securing Elements for an IC Assembly

For each of the plurality of orifices 720, a securing element 800 is provided that is configured to compress (or maintain a compressed state of) the large substrate 710 together with various other IC assembly components, including at least a PCB component and an elastomeric connector.

Preferably, the securing element 800 comprises a shoulder screw that may be inserted into the large substrate 710 and a terminal end or a distal end of the shoulder screw may be bottomed at a fastening member, such as nut. In a preferred embodiment, once the shoulder screw 800 is installed within an integrated circuit assembly, a shoulder (or abutment portion) of the shoulder screw 800 may come into contact with a body of a fastening member (e.g., fastening member 830) and an abutment portion of the shoulder screw 800 may come into contact with one or more elastic members (e.g., the elastic members 820, Bellville springs, etc.). In this preferred embodiment, the contact of the shoulder of the shoulder screw 800 to a body or top surface of the body of the fastening member may cause the abutment portion to come into contact with the one or more elastic members 820 thereby partially compressing the one or more elastic members 820 with the abutment portion. As mentioned above, the shoulder screw 800 may include a slotted head portion (e.g., a screw head) and an extending member that extends from an opposite surface of the slots in the head portion. Threading may be formed at a terminal end or a distal end (or along a surface) of the extending member of the shoulder screw 800. An abutment portion of the shoulder screw 800 may be positioned along the extending member and spaced a longitudinal distance away from the slotted head portion. Between the slotted head portion and abutment portion of the shoulder screw 800 may be additional elastic members. Additionally, the shoulder screw 800 may include a mechanical gasket (e.g., an integrated O-ring) that functions to close an access hole of the orifice and seal the shoulder screw cavity.

Additionally, the securing element 800 includes an elastic member 820 that functions to enable the securing element 800 to be compressed and decompressed various amounts from a first position to a second position (and, reversely) preferably, while the securing element 800 is in an installed state in which the securing element 800 is fastened to the integrated circuit assembly. Specifically, each of the layer components forming the IC assembly (e.g., the IC stack) may vary in dimensions according to an environmental condition or an operating status of the resulting integrated circuit. For instance, according to temperature variations within the IC stack, the components forming the stack may expand when the temperature increases and contract when the temperature decreases. To account for the variation and to avoid damage to the IC assembly, the elastic member 820 may be disposed between a pressure applying portion of the securing element 800 and a surface of a component in the IC stack. In this way, the expansion and contraction (forces) of the stack of integrated circuit assembly components is absorbed (or accommodated) in the compression and decompression of the elastic member 820. The elastic member 820 preferably comprises a plurality of Bellville springs positioned between a surface of the abutment portion of the shoulder screw and a surface of a backing element (e.g., a stainless-steel plate) or layer of the integrated circuit assembly. The plurality of Bellville springs may be stacked consecutively against each other with the top Bellville spring contacting a pressure applying portion of the securing element 800 and a bottom Bellville spring contacting a surface of a component of the IC assembly.

Additionally, a technical benefit in utilizing a plurality of Bellville springs stacked together includes the ability to spread an expansion load across each of the disparate Bellville springs in the stack of Bellville springs. That is, when the temperature of the IC assembly causes an expansion or the like of the component therein, the expansion load may be applied to each Bellville in the Bellville stack with near equal force or loading. Because the expansion load is spread among each of the Bellville springs in the stack, this prevents the elastic member 820 from bottoming out. Once another type of spring or similar elastomeric spring (other than a Bellville spring) bottoms out, the pressure from expansion in the IC assembly can no longer be accommodated by such device and may result in the components of the IC assembly being adversely affected (e.g., breaking, cracking, bending, etc.) by the expansion loading.

It shall be noted that the elastic member 820 may be any type of elastic device capable of storing mechanical energy. For instance, in one implementation, the elastic member 820 may comprise a coil spring (or any other suitable elastomeric spring).

Additionally, or alternatively, a fastening member 830 may be provided at the PCB or panel of the IC assembly for fastening the securing element 800. Preferably, the fastening member 830 comprises a nut with a threaded hole that is configured to receive the terminal end with threading of the securing element 800. The fastening member 830 may be disposed within (e.g., embedded) the PCB or panel of the IC assembly. Alternatively, the fastening member 830 may be disposed on one side of the PCB or panel of the IC assembly. The one side of the PCB may be a surface of the PCB that is opposite an entry surface of the PCB where the securing element 800 enters the PCB.

Additionally, or alternatively, the securing element 800 may be configured such that when the securing element 800 is secured into the fastening member 830, a shoulder of the securing element 800 rests against a surface of the fastening element 830 and thus, providing a fixed distance between the fastening element 830 and the slotted head portion of the securing element 800.

3.3 Pressing/Clamping Assembly

Figure 9A:
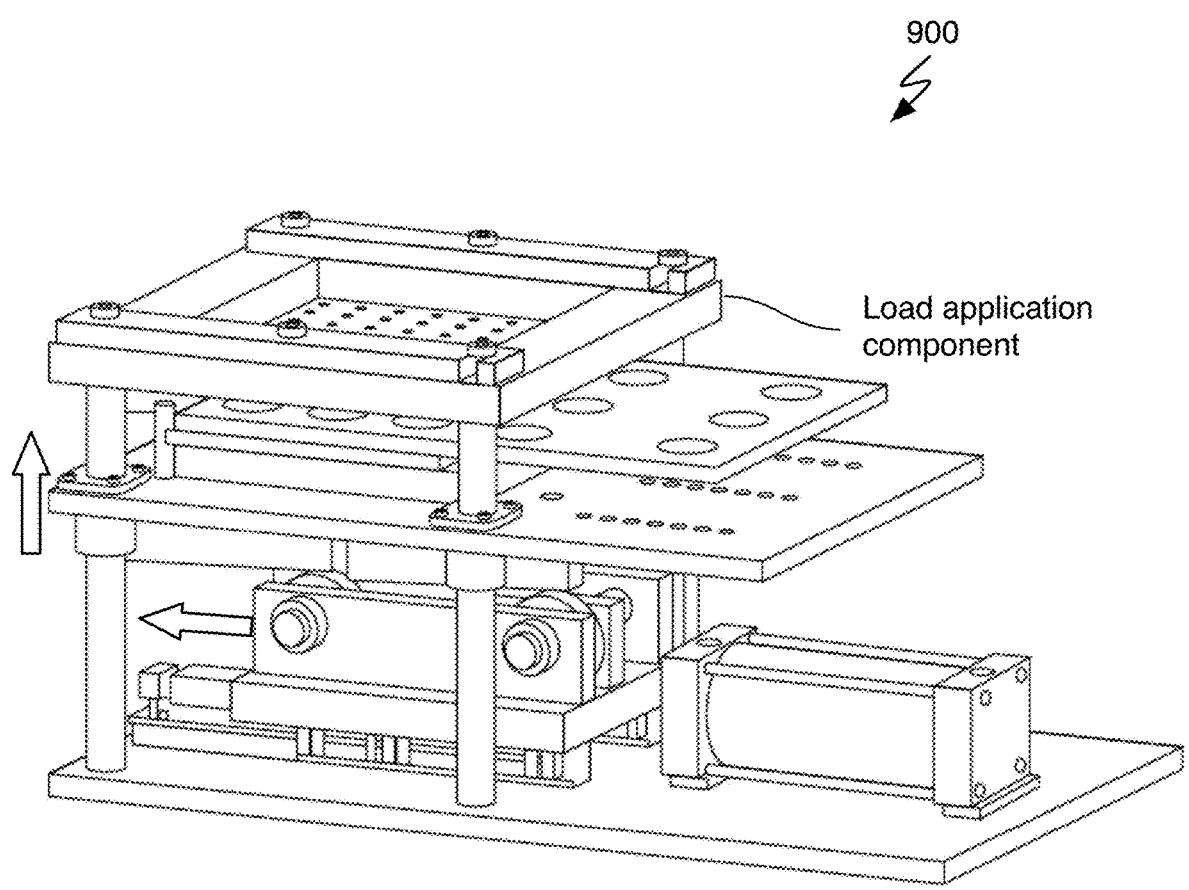
FIGS. 9A-B illustrate a first and second schematic of a pressing assembly 900 in accordance with one or more embodiments of the present application, respectively.
Figure 9B:
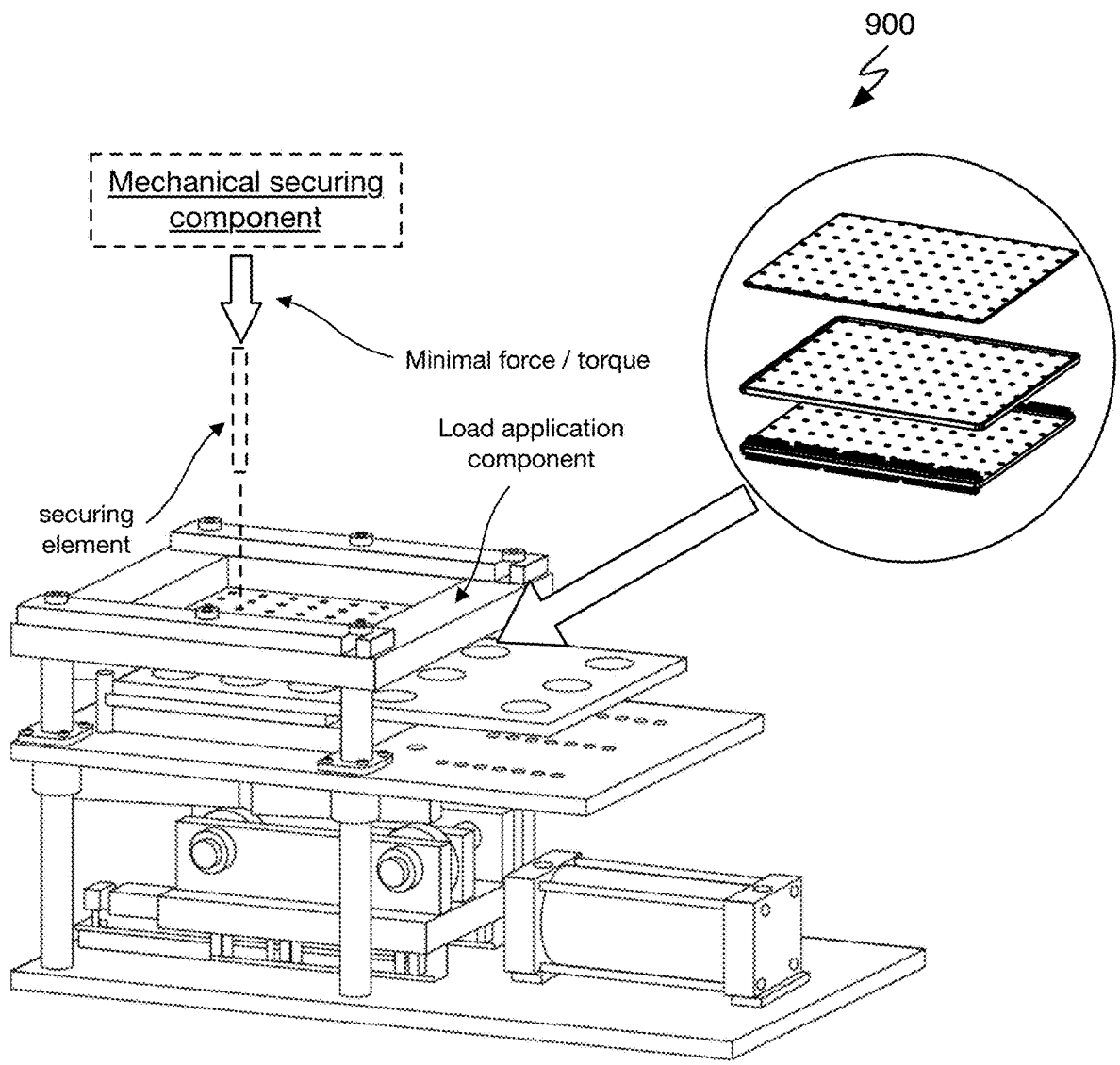

As shown in FIG. 9, a clamping assembly 900 is provided for pressing and/or assembling together the components of the IC assembly. The clamping assembly 900 may include a load application component that is configured to apply a mechanical load (e.g., up to four tons or more) against one or more components of the IC assembly. The clamping assembly 900 may also include a mechanical securing component that is configured to enable fastening of the securing element 800 of the IC assembly.

In use, the clamping assembly 900 may first apply a mechanical compression load to the elastic member 820 and once a desired mechanical load is achieved, the clamping assembly (or other device) may be triggered to fasten the securing elements 800 into the IC assembly. Specifically, the mechanical load applied by the clamping assembly 900 may be uniformly applied between the fastening members 830 of supporting members of the substrate or PCB and to the elastic members 820 distributed throughout the IC assembly at locations at which a plurality of the securing elements 800 are inserted. Additionally, or alternatively, each securing element 800 may be inserted and fastened until a shoulder of the securing element 800 comes into contact with the fastening member 830 and no further (i.e., a minimum force and torque may be applied to the securing element 800 that allows it to travel through the elastic member 820 until the shoulder of the securing element 800 comes into contact with the fastening member 830). In other words, a compression of the elastic member 820 may not be provided by torque applied to the securing element 800, but rather, by the clamping assembly 900 until the securing element 800 may be fastened into position, at which time the clamping assembly 900 may release a pressure (or the mechanical load) which may be transferred to the securing element 800. Attempting to fasten each securing element 800 into place while moving against an opposing pressure of the elastic member 920 would cause it to be very difficult to maintain uniform pressure across the IC assembly during the securing process when using the torque or the orientation of the securing element. Instead, a uniform pressure may be applied (to the elastic members 820) by the clamping assembly 900 via another means (e.g., a load application component) and structure until all the securing elements 800 are in place and therefore, a compression distance, as defined by a distance between center points (e.g., a longitudinal center extending through a head portion of securing element 800) of two adjacent securing elements 800 across an IC assembly may be set.

Additionally, the clamping assembly 900 may be configured to enable synchronous fastening of the plurality of securing elements 800 into the IC assembly. For instance, in some embodiments, one hundred four (104) securing elements 800 may be used for securing together the IC assembly. In such embodiments, the clamping assembly 900 may be configured to simultaneously fasten all 104 securing elements 800 into the IC assembly to ensure a uniform load is applied by the securing elements 800. The clamping assembly 900 may function to release the mechanical loading (i.e., decompressing the integrated circuit assembly) once the fastening of the securing elements 800 is completed or once the securing elements 800 are fastened into position.

3.4 Method of Securing an IC Assembly

As shown in FIG. 1100, a method 1100 for securing an integrated circuit assembly includes providing the IC assembly components 1105; arranging the IC assembly components S1110; providing a plurality of securing elements to the IC assembly S1120; implementing a pressing process S1130, fastening the plurality of securing elements within the IC assembly S1140; and terminating the pressing process S1150.

S1105, which includes providing the IC assembly components, functions to configure each of the assembly components for receiving a plurality of securing elements. Specifically, S1105 functions to prepare the IC assembly components by fabricating (e.g., drilling, etc.) a plurality of orifices within each of the IC assembly components for receiving a plurality of securing elements, which includes fabricating orifices within the active circuitry layer of the semiconductor substrate layer of the integrated circuit assembly. Accordingly, S1105 may function to fabricate in each of the IC assembly components (e.g., the large substrate (wafer), the elastomeric connector, the PCB, the cooling plate, etc.) a same number of orifices that may be placed in alignment when the IC assembly components are stacked together. In some embodiments, S1105 may function to fabricate and position the orifices along the surfaces of each of the IC assembly components according to a first predetermined pitch along a first direction (e.g., a horizontal direction) of the IC assembly and according to a second predetermined pitch along a second direction (e.g., a longitudinal direction) of the IC assembly. Alternatively, S1105 may function to fabricate and position the plurality of orifices using a same pitch across the IC assembly.

Additionally, or alternatively, S1105 may function to provide alignment markers or alignment points within each of the IC assembly components that enable each of the IC assembly components to easily be placed in alignment with each other.

S1110, which includes arranging the IC assembly components, functions to arrange each of the IC assembly components in order and in alignment, preferably, within a pressing assembly. Specifically, S1110 may function to logically order the IC assembly components to enable signal connectivity (once compressed) and place the IC assembly components in an alignment position with respect to each other that enables an insertion of respective securing elements within the aligned orifices of the IC assembly components. As shown in FIG. 10, S1110 functions to position (or sandwich) an elastomeric connector between the large substrate and a PCB in such a manner that each of the orifices of each IC assembly component is aligned along a central axis formed through respective orifices of the large substrate, the elastomeric connector, and the PCB. The IC assembly, of course, can include other components, such as steel plates (for support), and cooling plates (e.g., a heat sink) that may also be placed in alignment as described in accordance with S1110.

S1120, which includes implementing a pressing process, functions to initiate a pressing of one or more components of the IC assembly preferably using a pressing apparatus. Prior to or contemporaneously with a provisioning of the securing elements, S1120 functions to compress a plurality of elastic members (e.g., Bellville springs) at each of the aligned orifices. Accordingly, a predetermined mechanical load may be applied to each stack of elastic members that enables the insertion and fastening of the securing elements without a significant force required to fasten the securing elements. That is, S1120 enables the fastening of the securing elements without counter forces of the stack of elastic members working against the fastening process.

S1130, which includes providing securing elements to the IC assembly, functions to insert each of a plurality of securing elements into the aligned orifices of the IC assembly. Accordingly, while one or more components of the IC assembly may be under compression (e.g., the elastic members), S1130 functions to insert a securing element within each of the available orifices. As mentioned above, inserting the securing elements into the orifices in this manner enables an efficient fastening process (e.g., use of minimal torque) of the securing elements because potentially counter forces of the elastic member may be temporarily neutralized.

S1140, which includes securing the plurality of securing elements within the IC assembly, functions to implement a fastening process of the plurality of securing elements preferably while one or more components of the IC assembly may be under a mechanical compression load by the pressing assembly. Thus, once the plurality of securing elements are inserted into the IC assembly, S1140 may function to mechanically fasten each of the plurality of securing elements into the IC assembly and preferably, until a portion (e.g., threaded portion) of each of the plurality of securing elements is fastenedly placed within a respective fastening member (e.g., mechanical nut) at the PCB. S1140 may function to stop a fastening process of each securing element once a shoulder of the securing element abuts a surface of a fastening member or an IC assembly component.

Responsive to a fastening of each of the plurality of securing elements into the IC assembly, S1150, which includes terminating the pressing process, functions to release or terminate the mechanical loading applied to the elastic members. The termination of the mechanical loading enables each of the stacks of elastic members to decompress to a position that abuts a pressure applying surface of the securing element.

It shall be noted that the systems and methods described herein for clamping and securing an IC may be applicable to any type and/or size of substrate, assembly, or wafer and thus, the embodiments of the present application should not be limited to large substrates, such as large substrate 710. As an example, the systems and method clamping and securing an IC may be applied to reconstructed wafers in addition to non-cut wafers (e.g., large multi-die wafers, etc.). A reconstructed wafer may be constructed or reconstituted according to various processes. In one instance, a reconstructed wafer may be constructed of a wafer carrier in which singulated die have been assembled to the wafer carrier. In another instance, a reconstructed wafer may be made of an array of die embedded in a molded compound that provides mechanical support the combination of which may be tantamount or equivalent to a wafer fabricated according to standard processes (including the novel processes described herein).

It shall be understood that the method 1100 is an exemplary method that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. A system of securing an integrated circuit assembly, the system comprising:
a clamping assembly comprising a load application component that:
applies a first mechanical load against one or more of a plurality of layer components of an integrated circuit assembly; and a mechanical securing component that fastens each of a plurality of securing elements within the integrated circuit assembly by applying a second mechanical load to each of a plurality of securing elements while the first mechanical load is continuously applied against the one or more of the plurality of layer components of the integrated circuit assembly, wherein the load application component is configured to release the first mechanical load, thereby generating a third mechanical load greater than the second mechanical load at each of the plurality of securing elements.

2. The system according to claim 1, wherein:
at least one layer component of the plurality of layer components of the integrated circuit assembly comprises a semiconductor substrate having:
   a plurality of die formed with the semiconductor substrate;
   a circuit layer formed at each of the plurality of die; and
   a plurality of inter-die connections that communicatively connect disparate die formed with the substrate, wherein each of the plurality of inter-die connections extends between distinct pairs of die of the plurality of die.

3. The system according to claim 1, wherein
one or more layer components of the plurality of layer components have a plurality of orifices;
the plurality of securing elements are arranged within the plurality of orifices of the one or more layer components.

4. The system according to claim 1, wherein
the plurality of layer components comprising:
   a printed circuit board (PCB) substrate; and
   a compliant connector arranged between a semiconductor substrate and the PCB substrate.

5. The system according to claim 1, wherein:
the plurality of securing elements comprise a plurality of shoulder screws installed into a plurality of orifices of the integrated circuit assembly; and
an abutment portion of each of the plurality of shoulder screws comes into with a body of a fastener and one or more elastic members.

6. The system according to claim 5, wherein:
each of the plurality of securing elements comprises the one or more elastic members arranged between an abutment portion of each securing element and a surface of one of the plurality of layers of the integrated circuit assembly,
the elastic member absorbs expansion forces and contraction forces of the one or more of the plurality of layer components of the integrated circuit assembly.

7. The system according to claim 1, wherein:
each of the plurality of securing elements comprise a plurality of elastic members disposed between a surface of an abutment portion of each securing element of the plurality of securing elements and a surface of a layer component comprising a backing element of the integrated circuit assembly; and
fastening each of the plurality of securing elements into the integrated circuit assembly causes the surface of the abutment portion to come into contact with the plurality of the elastic members and compress the plurality of elastic members from a first uncompressed position to a second compressed position.

8. The system according to claim 6, wherein
the elastic member comprises a plurality of Belleville springs.

9. The system according to claim 1, further comprising:
a plurality of fastening members within or at a surface of an electronic circuit substrate of the integrated circuit assembly, wherein fastening the plurality of securing elements includes fastening one end of each of the plurality of securing elements within one fastening member of the plurality of fastening members.

10. The system according to claim 3, wherein
each of the plurality of orifices comprises a through hole that extends through at least one of the plurality of layer components of the integrated circuit assembly.

11. The system according to claim 3, wherein
each orifice comprises a through hole that extends through at least one of the plurality of layer components of the integrated layer assembly and terminates at a cavity within a terminal layer of the integrated circuit assembly.

12. The system according to claim 1, wherein
the mechanical securing component simultaneously fastens each of the plurality of securing elements into the integrated circuit assembly.

13. The system according to claim 1, wherein
the mechanical securing component synchronously fastens each of the plurality of securing elements into the integrated circuit assembly while the integrated circuit assembly is maintained in a compressed state based on the mechanical load.

14. The system according to claim 1, wherein
the load application component releases the plurality of layer components of the integrated circuit assembly from a compressed state to an uncompressed state based on the fastening of the plurality of securing elements to the integrated circuit assembly.

15. The system according to claim 1, wherein
the load application component maintains a uniform pressure across the plurality of layer components the integrated circuit assembly based on the load application until the plurality of securing elements are fastened.

16. The system according to claim 1, wherein
the mechanical securing component is triggered to fasten each of the plurality of securing elements once a desired mechanical load is achieved by the load application component.

17. The system of claim 1, wherein the load application component comprises a pressing component.

18. The system of claim 1, wherein the load application component and the mechanical securing component are configured to independently compress the plurality of layers.

19. The system of claim 3, wherein the plurality of orifices comprises a first orifice and a second orifice, the second orifice separated from the first orifice by more than 100 millimeters.

20. The system of claim 18, wherein the plurality of layer components comprises an integrated circuit, wherein each of the plurality of securing elements extends through a thickness of the integrated circuit.

* * * * *